(12) United States Patent
Kim et al.

(10) Patent No.: US 11,778,821 B2
(45) Date of Patent: Oct. 3, 2023

(54) SEMICONDUCTOR MEMORY DEVICES AND METHODS FOR FABRICATING THE SAME

(71) Applicant: Samsung Electronics Co., Ltd., Suwon-si (KR)

(72) Inventors: Joon Sung Kim, Seoul (KR); Byoung Il Lee, Hwaseong-si (KR); Seong-Hun Jeong, Hwaseong-si (KR); Jun Eon Jin, Suwon-si (KR)

(73) Assignee: Samsung Electronics Co., Ltd.

( * ) Notice: Subject to any disclaimer, the term of this patent is extended or adjusted under 35 U.S.C. 154(b) by 300 days.

(21) Appl. No.: 17/037,074

(22) Filed: Sep. 29, 2020

(65) Prior Publication Data

US 2021/0265389 A1    Aug. 26, 2021

(30) Foreign Application Priority Data

Feb. 25, 2020  (KR) ........................ 10-2020-0022667

(51) Int. Cl.
  *H01L 27/11582* (2017.01)
  *H01L 27/11565* (2017.01)
  (Continued)

(52) U.S. Cl.
  CPC .............. *H10B 43/27* (2023.02); *G11C 7/18* (2013.01); *G11C 8/14* (2013.01); *H01L 23/5226* (2013.01);
  (Continued)

(58) Field of Classification Search
  CPC ......... H01L 27/11575; H01L 27/11565; H01L 27/1157; H01L 27/11573; H01L 27/11582; H01L 27/11524; H01L 27/11526; H01L 27/11551; H01L 23/5226; H01L 23/5283; H01L 21/76816; H01L 21/76865; H01L 21/76877; H01L 21/76831; H01L 27/11529; H01L 27/11556; H10B 43/27; H10B 41/35; H10B 41/41; H10B 41/27; H10B 43/35; H10B 43/40; H10B 43/50
  See application file for complete search history.

(56) References Cited

U.S. PATENT DOCUMENTS 8,564,050 B2  10/2013  Park et al.
8,681,555 B2   3/2014  Liu
(Continued)

*Primary Examiner* — Mary A Wilczewski
*Assistant Examiner* — Tsz K Chiu
(74) *Attorney, Agent, or Firm* — Myers Bigel, P.A.

(57) ABSTRACT

A semiconductor memory device with improved reliability and a related method are provided. The semiconductor memory device includes a mold structure including a plurality of gate electrodes and a plurality of mold insulating films on a first substrate, a channel structure penetrating the mold structure and crossing a respective level of each of the gate electrodes, a plurality of first insulating patterns in the mold structure, the first insulating patterns including a material different from that of the mold insulating films, and a first through via in the first insulating patterns, the first through via penetrating the first substrate and the mold structure. The gate electrodes include a first word line and a second word line on the first word line. A first distance from the first word line to the first through via is different from a second distance from the second word line to the first through via.

20 Claims, 32 Drawing Sheets

(51) Int. Cl.
| | |
|---|---|
| *H01L 23/528* | (2006.01) |
| *H01L 27/1157* | (2017.01) |
| *H01L 27/11573* | (2017.01) |
| *H01L 23/522* | (2006.01) |
| *H01L 27/11575* | (2017.01) |
| *H10B 43/27* | (2023.01) |
| *G11C 8/14* | (2006.01) |
| *G11C 7/18* | (2006.01) |
| *H10B 41/10* | (2023.01) |
| *H10B 41/27* | (2023.01) |
| *H10B 41/40* | (2023.01) |
| *H10B 43/10* | (2023.01) |
| *H10B 43/40* | (2023.01) |

(52) U.S. Cl.
CPC ............ *H10B 41/10* (2023.02); *H10B 41/27* (2023.02); *H10B 41/40* (2023.02); *H10B 43/10* (2023.02); *H10B 43/40* (2023.02)

(56) References Cited

U.S. PATENT DOCUMENTS

| | | | |
|---|---|---|---|
| 9,514,827 | B1 | 12/2016 | Nam et al. |
| 9,653,562 | B2 | 5/2017 | Kim et al. |
| 9,691,782 | B1 | 6/2017 | Hwang et al. |
| 10,249,640 | B2* | 4/2019 | Yu ..................... H01L 27/11573 |
| 10,290,648 | B1* | 5/2019 | Zhou ..................... H10B 43/27 |
| 10,381,371 | B2 | 8/2019 | Ogawa et al. |
| 10,896,918 | B1* | 1/2021 | Oh ..................... H01L 27/11556 |
| 11,043,455 | B2* | 6/2021 | Kai ..................... H01L 23/535 |
| 11,282,827 | B2* | 3/2022 | Yun ..................... H01L 27/11565 |
| 2016/0027730 | A1* | 1/2016 | Lee ..................... H01L 27/11565 257/774 |
| 2017/0358593 | A1* | 12/2017 | Yu ..................... H10B 43/27 |
| 2018/0122814 | A1 | 5/2018 | Baraskar et al. |
| 2019/0081062 | A1* | 3/2019 | Wada ..................... H01L 27/11568 |
| 2019/0081067 | A1 | 3/2019 | Eom et al. |
| 2019/0237477 | A1 | 8/2019 | Baek et al. |
| 2019/0267333 | A1* | 8/2019 | Hong ..................... H01L 27/11565 |

\* cited by examiner

SEMICONDUCTOR MEMORY DEVICES AND METHODS FOR FABRICATING THE SAME

CROSS-REFERENCE TO RELATED APPLICATION

This application claims priority from Korean Patent Application No. 10-2020-0022667, filed on Feb. 25, 2020 in the Korean Intellectual Property Office, and all the benefits accruing therefrom under 35 U.S.C. 119, the entire contents of which are herein incorporated by reference.

BACKGROUND

1. Technical Field

The present disclosure relates to semiconductor memory devices and methods for fabricating the same. More particularly, the present disclosure relates to semiconductor memory devices including a through via and methods for fabricating the same.

2. Description of the Related Art

In order to satisfy consumer demands for superior performance and inexpensive prices, it is desired to increase the integration density of semiconductor memory devices. In a semiconductor memory device, since the integration density of the semiconductor memory device is an important factor in determining the price of a product, an increased integration density is particularly desirable.

Meanwhile, in the case of a two-dimensional or planar semiconductor memory device, the integration density is mainly determined by the area occupied by a unit memory cell, and thus the integration density is greatly influenced by the level of fine pattern formation technology. However, since extremely high-priced equipment may be used for the miniaturization of patterns, the integration density of the two-dimensional semiconductor memory device has been increased but is still limited. Accordingly, three-dimensional semiconductor memory devices having memory cells arranged three-dimensionally have been proposed.

SUMMARY

Aspects of the present disclosure provide a semiconductor memory device with improved product reliability.

Aspects of the present disclosure also provide a method for fabricating a semiconductor memory device with improved product reliability.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present inventive concept, there is provided a semiconductor memory device comprising a mold structure including a plurality of gate electrodes and a plurality of mold insulating films that are alternately stacked on a first substrate, a channel structure penetrating the mold structure and crossing a respective level of each of the gate electrodes, a plurality of first insulating patterns in the mold structure, the first insulating patterns being alternately stacked with the mold insulating films and including a material different from that of the mold insulating films, and a first through via in the first insulating patterns, the first through via penetrating the first substrate and the mold structure, wherein the gate electrodes include a first word line and a second word line on the first word line, and wherein a first distance from the first word line to the first through via is different from a second distance from the second word line to the first through via.

According to an aspect of the present inventive concept, there is provided a semiconductor memory device comprising a mold structure including a plurality of gate electrodes that are spaced apart from each other and stacked on a substrate, a channel structure penetrating the mold structure and crossing a respective level of each of the gate electrodes, a plurality of insulating patterns spaced apart from each other and stacked in the mold structure, and a through via in the insulating patterns, the through via penetrating the substrate and the mold structure, wherein the gate electrodes include a first word line and a second word line on the first word line, wherein the insulating patterns include a first insulating line stacked at the same level as the first word line, and a second insulating line stacked at the same level as the second word line, and wherein a first distance from a first boundary surface between the first word line and the first insulating line to the through via is different from a second distance from a second boundary surface between the second word line and the second insulating line to the through via.

According to an aspect of the present inventive concept, there is provided a semiconductor memory device comprising a plurality of mold insulating films spaced apart from each other and stacked on a substrate, a first word line group alternately stacked with some of the mold insulating films, a second word line group on the first word line group, the second word line group being alternately stacked with others of the mold insulating films, a channel structure crossing levels of each of the mold insulating films, the first word line group, and the second word line group, a plurality of first insulating lines spaced from each other and alternately stacked with the some of the mold insulating films, a plurality of second insulating lines on the first insulating lines, the second insulating lines being spaced from each other and alternately stacked with the others of the mold insulating films, and a first through via crossing the levels of each of the mold insulating films, levels of each of the first insulating lines, and levels of each of the second insulating lines, wherein the first insulating lines, the second insulating lines, and the mold insulating films include three different respective materials.

According to an aspect of the present inventive concept, there is provided a method for fabricating a semiconductor memory device, the method comprising forming a mold structure including a plurality of mold insulating films and a plurality of first insulating patterns alternately stacked on a substrate, forming a channel structure penetrating the mold structure and crossing levels of each of the mold insulating films and each of the first insulating patterns, removing a portion of each of the first insulating patterns to form a plurality of first insulating lines alternately stacked with some of the mold insulating films and a plurality of second insulating lines alternately stacked with others of the mold insulating films, forming a plurality of gate electrodes alternately stacked with the mold insulating films in a region where the portion of each of the first insulating patterns is removed, forming a through via in the first insulating lines and the second insulating lines, the through via penetrating the substrate and the mold structure, wherein a width of each of the first insulating lines is different from a width of each of the second insulating lines.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

Hereinafter, a semiconductor memory device according to some embodiments will be described with reference to FIGS. 1 to 17.

Figure 1:
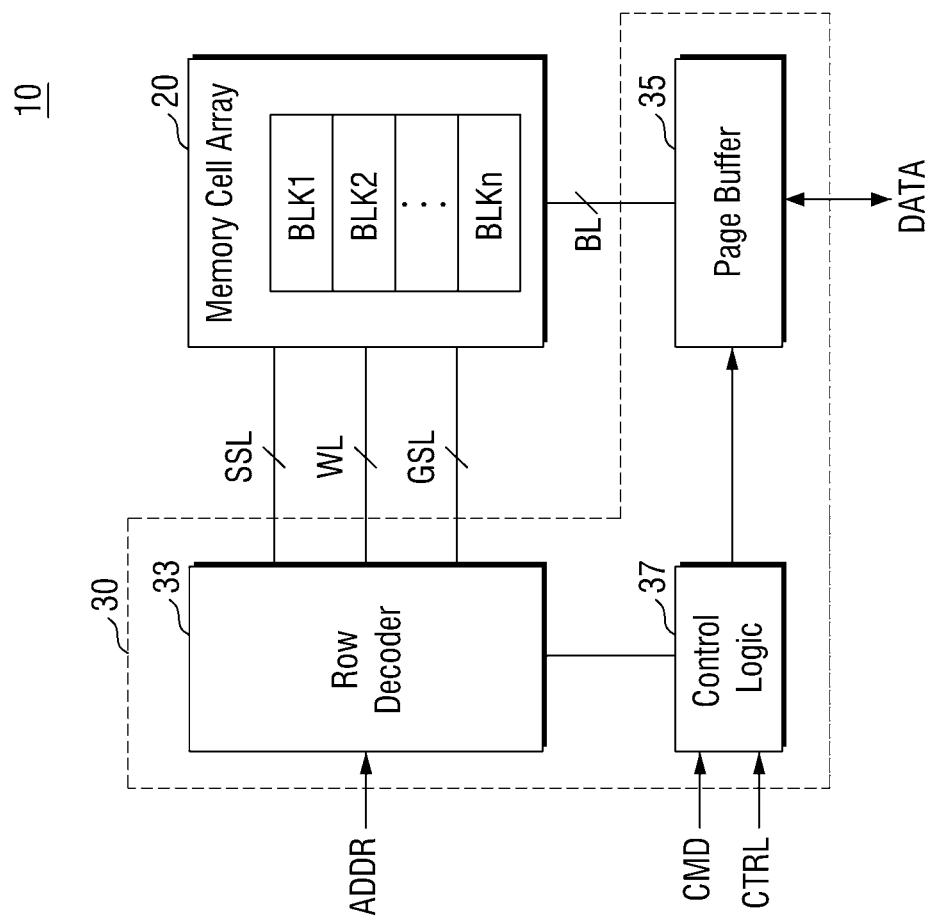
FIG. 1 is a block diagram of a semiconductor memory device according to some embodiments.

FIG. 1 is a block diagram of a semiconductor memory device according to some embodiments.

Referring to FIG. 1, a semiconductor memory device 10 according to some embodiments may include a memory cell array 20 and a peripheral circuit 30.

The memory cell array 20 may include a plurality of memory cell blocks BLK1 to BLKn. Each of the memory cell blocks BLK1 to BLKn may include a plurality of memory cells. The memory cell blocks BLK1 to BLKn may be connected to the peripheral circuit 30 through bit lines BL, word lines WL, at least one of a plurality of string select lines SSL, and at least one of a plurality of ground select lines GSL. As used herein, the term "connected" may refer to elements that are electrically connected to each other.

Specifically, the memory cell blocks BLK1 to BLKn may be connected to a row decoder 33 through the word lines WL, at least one of the string select lines SSL, and at least one of the ground select lines GSL. Further, the memory cell blocks BLK1 to BLKn may be connected to a page buffer 35 through the bit lines BL.

The peripheral circuit 30 may receive an address ADDR, a command CMD, and a control signal CTRL from outside of (e.g., from a device that is external to) the semiconductor memory device 10, and may transmit and receive data DATA to and from an external device of the semiconductor memory device 10. The peripheral circuit 30 may include a control logic 37, the row decoder 33 and the page buffer 35.

Although not shown, the peripheral circuit 30 may further include various sub-circuits such as an input/output circuit, a voltage generation circuit for generating various voltages required for the operation of the semiconductor memory device 10, and an error correction circuit for correcting an error of data DATA read from the memory cell array 20.

The control logic 37 may be connected to the row decoder 33, the input/output circuit and the voltage generation circuit. The control logic 37 may control an overall operation of the semiconductor memory device 10. The control logic 37 may generate various internal control signals used in the semiconductor memory device 10 in response to the control signal CTRL. For example, the control logic 37 may adjust a voltage level provided to the word lines WL and the bit lines BL during the execution of a memory operation such as a program operation or an erase operation.

The row decoder 33 may select at least one of the plurality of memory cell blocks BLK1 to BLKn in response to the address ADDR. Further, the row decoder 33 may select at least one of the word lines WL, at least one of the string select lines SSL and at least one of the ground select lines GSL for the selected at least one of the memory cell blocks BLK1 to BLKn. The row decoder 33 may transmit a voltage for performing a memory operation to the word lines WL of the selected at least one of the memory cell blocks BLK1 to BLKn.

The page buffer 35 may be connected to the memory cell array 20 through the bit lines BL. The page buffer 35 may operate as a writer driver or a sense amplifier. Specifically, during the program operation, the page buffer 35 may operate as a write driver to apply, to the bit lines BL, a voltage corresponding to the data DATA intended to be stored in the memory cell array 20. On the other hand, during the read operation, the page buffer 35 may operate as a sense amplifier to sense the data DATA stored in the memory cell array 20.

Figure 2:
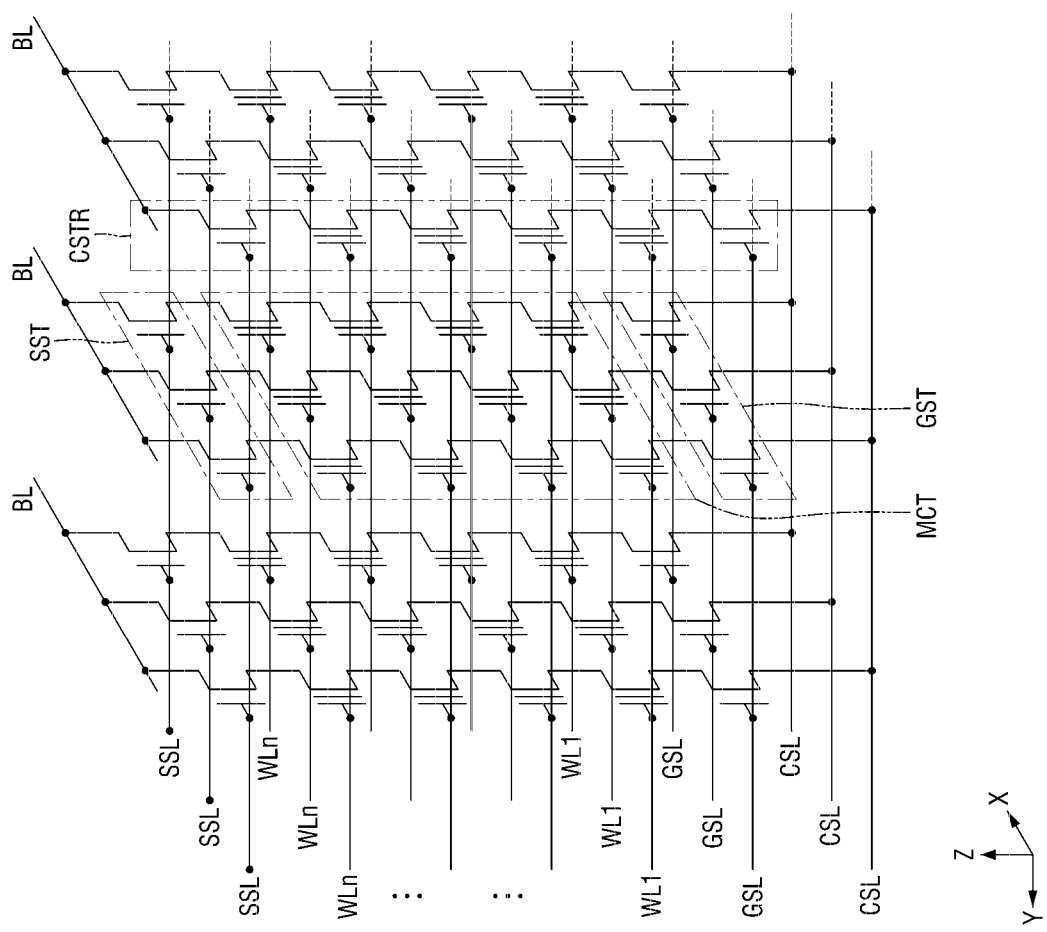
FIG. 2 is an example circuit diagram of a semiconductor memory device according to some embodiments.

FIG. 2 is an example circuit diagram of a semiconductor memory device according to some embodiments.

Referring to FIG. 2, a memory cell array (e.g., 20 of FIG. 1) of a semiconductor memory device according to some embodiments may include common source lines CSL, bit lines BL, and cell strings CSTR.

The bit lines BL may be arranged two-dimensionally. For example, the bit lines BL may be spaced apart from each other and extend in a first direction X. The plurality of cell strings CSTR may be connected in parallel to each of the bit lines BL. The cell strings CSTR may be commonly connected to the common source lines CSL. That is, the plurality of cell strings CSTR may be formed between the bit lines BL and the common source lines CSL.

The common source lines CSL may be arranged two-dimensionally. For example, the common source lines CSL may be spaced apart from each other in the first direction X and may each extend in a second direction Y. The same voltage may be applied to each of the common source lines CSL. Alternatively, different voltages may be applied to the common source lines CSL to be controlled separately.

In some embodiments, each of the cell strings CSTR may include a ground select transistor GST connected to the common source line CSL, a string select transistor SST connected to the bit line BL, and a plurality of memory cell transistors MCT interposed between the ground select transistor GST and the string select transistor SST. Each of the memory cell transistors MCT may include a data storage element. The ground select transistor GST, the string select transistor SST, and the memory cell transistors MCT may be connected in series.

The common source lines CSL may be commonly connected to sources of the ground select transistors GST. Further, a ground select line GSL, a plurality of word lines WL1 to WLn, and a string select line SSL may be formed between the common source line CSL and the bit line BL. The ground select line GSL may be used as a gate electrode of the ground select transistor GST. The plurality of word lines WL1 to WLn may be used as gate electrodes of the memory cell transistors MCT. The string select line SSL may be used as a gate electrode of the string select transistor SST.

Figure 3:
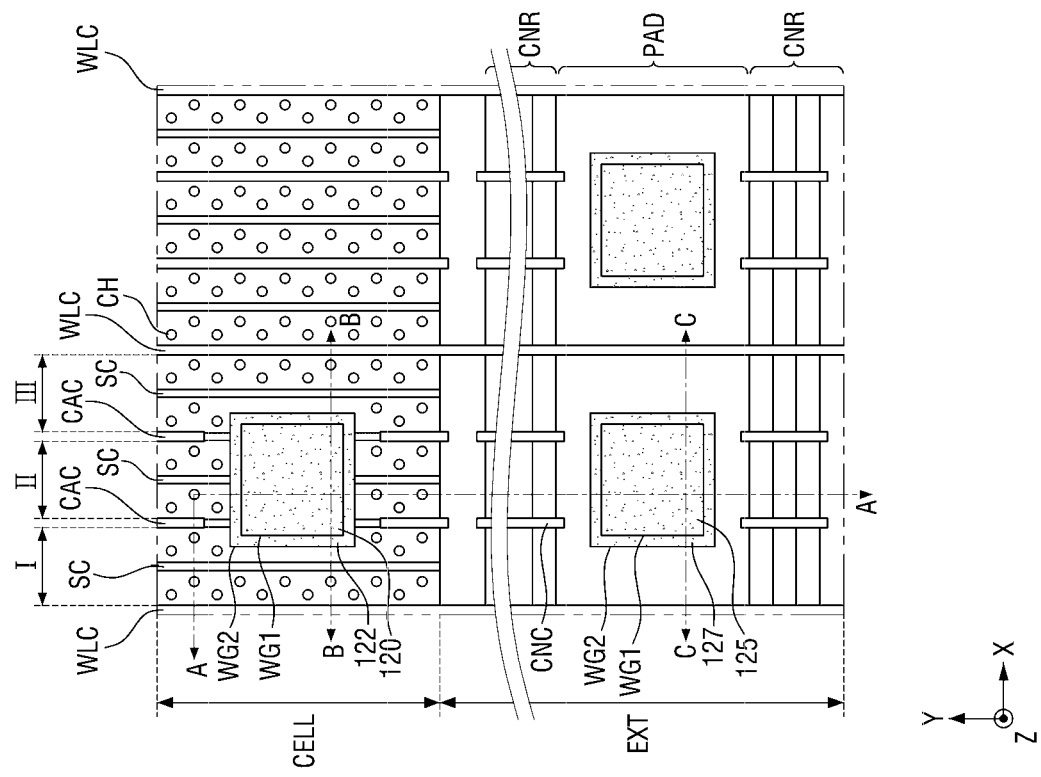
FIG. 3 is a layout diagram illustrating a semiconductor memory device according to some embodiments.
Figure 4:
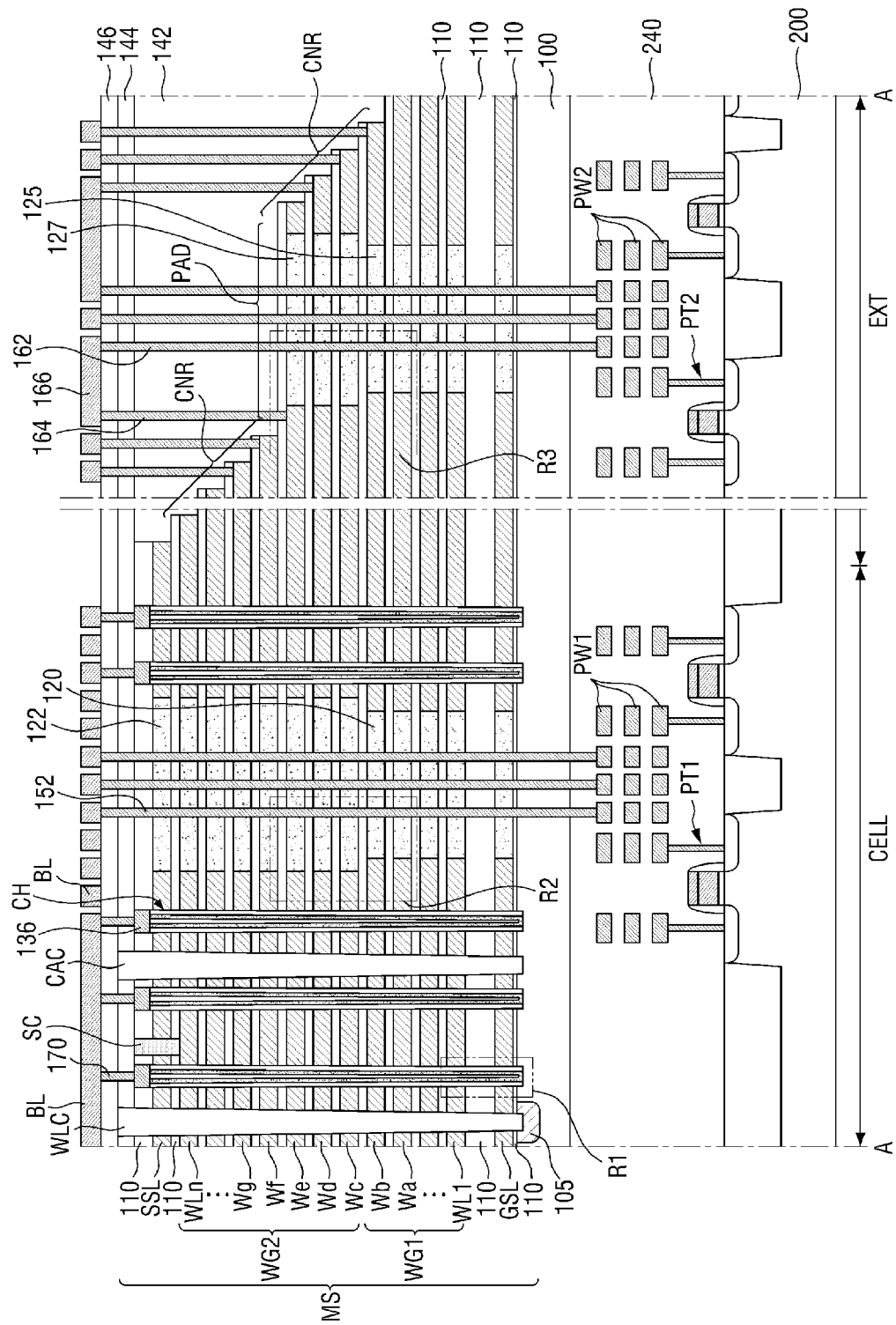
FIG. 4 is a cross-sectional view taken along line A-A of FIG. 3.
Figure 5A:
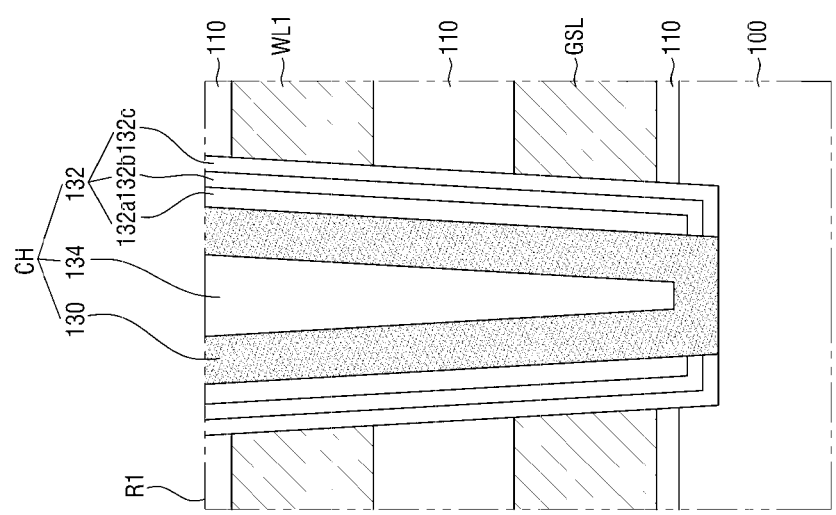
FIGS. 5A and 5B are various enlarged views of region R1 of FIG. 4.
Figure 5B:
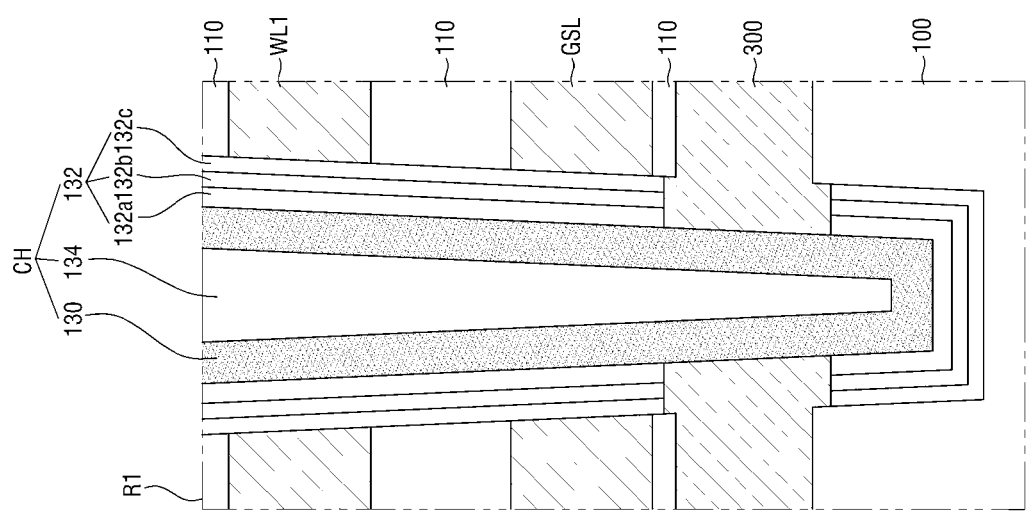
Figure 6A:
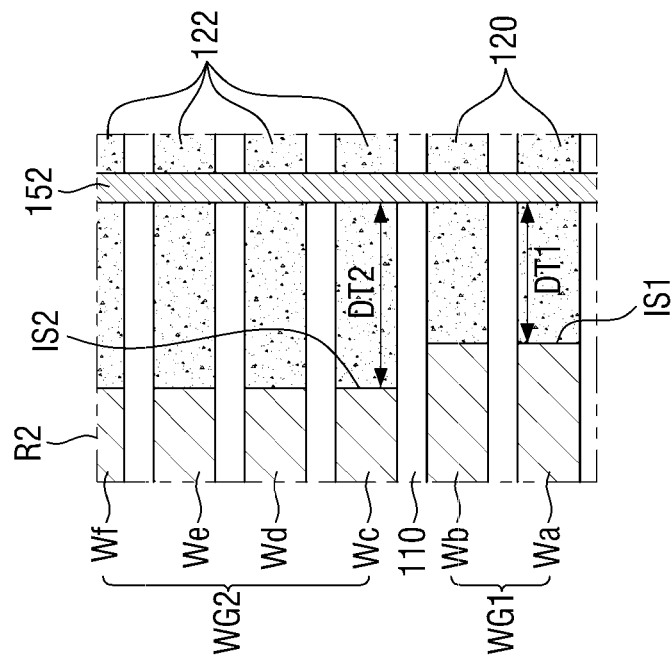
FIGS. 6A through 6E are various enlarged views of region R2 of FIG. 4.
Figure 7A:
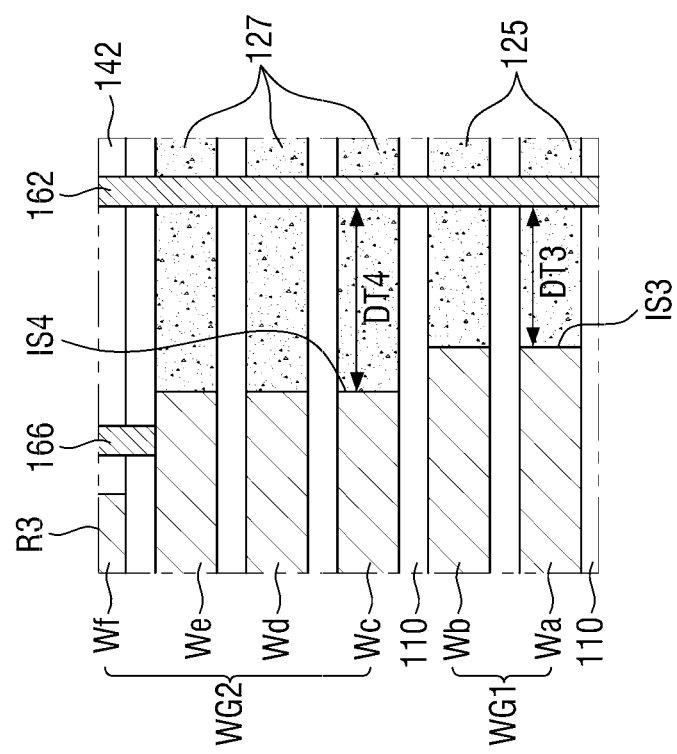
FIGS. 7A and 7B are various enlarged views of region R3 of FIG. 4.
Figure 7B:
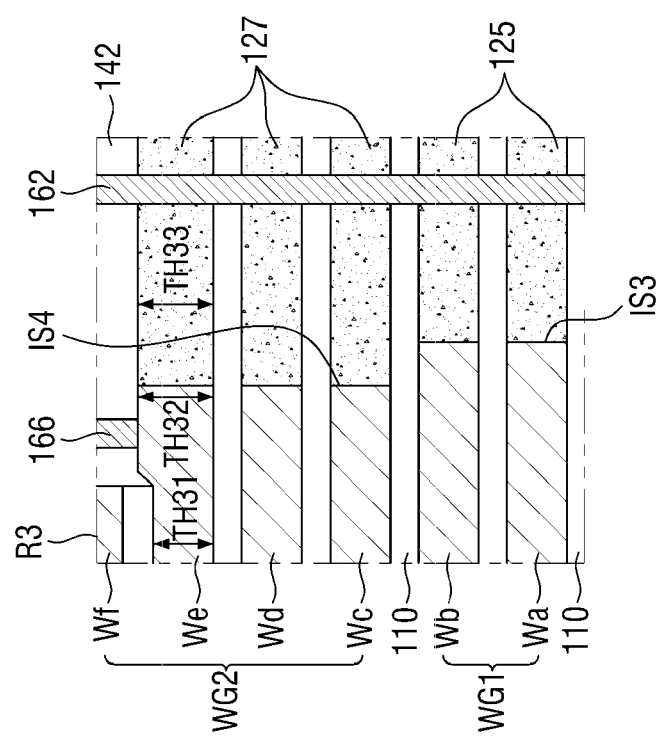
Figure 8:
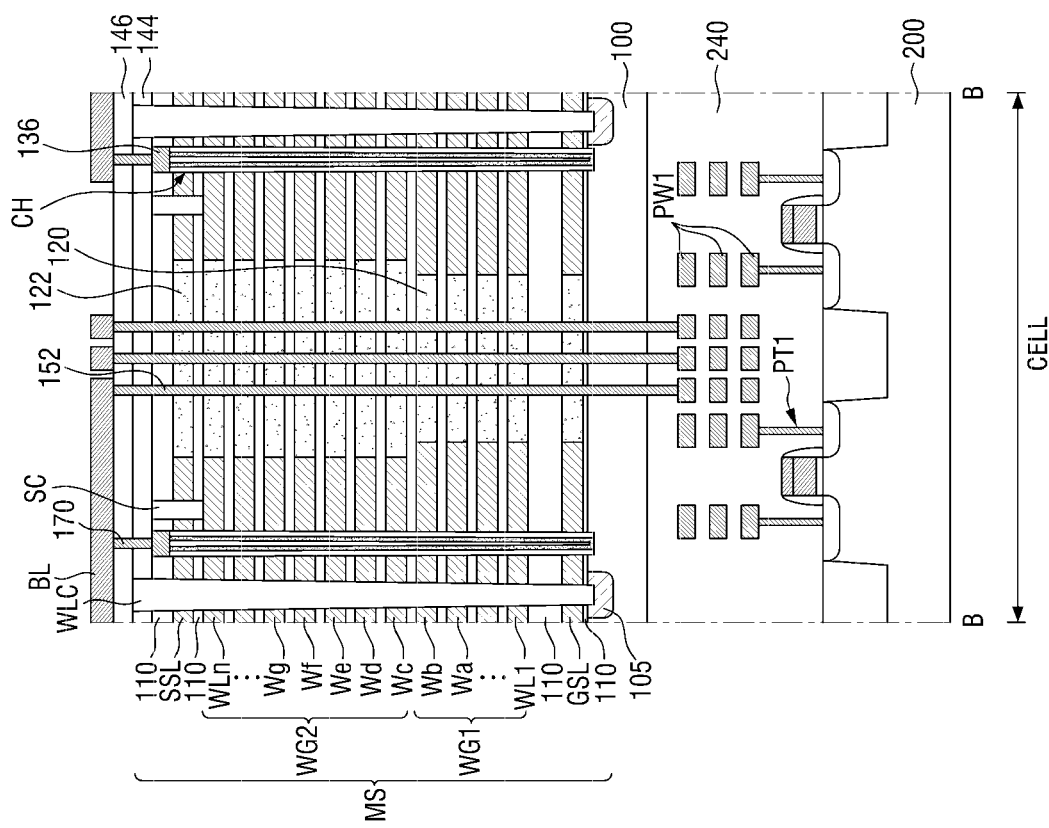
FIG. 8 is a cross-sectional view taken along line B-B of FIG. 3.
Figure 9:
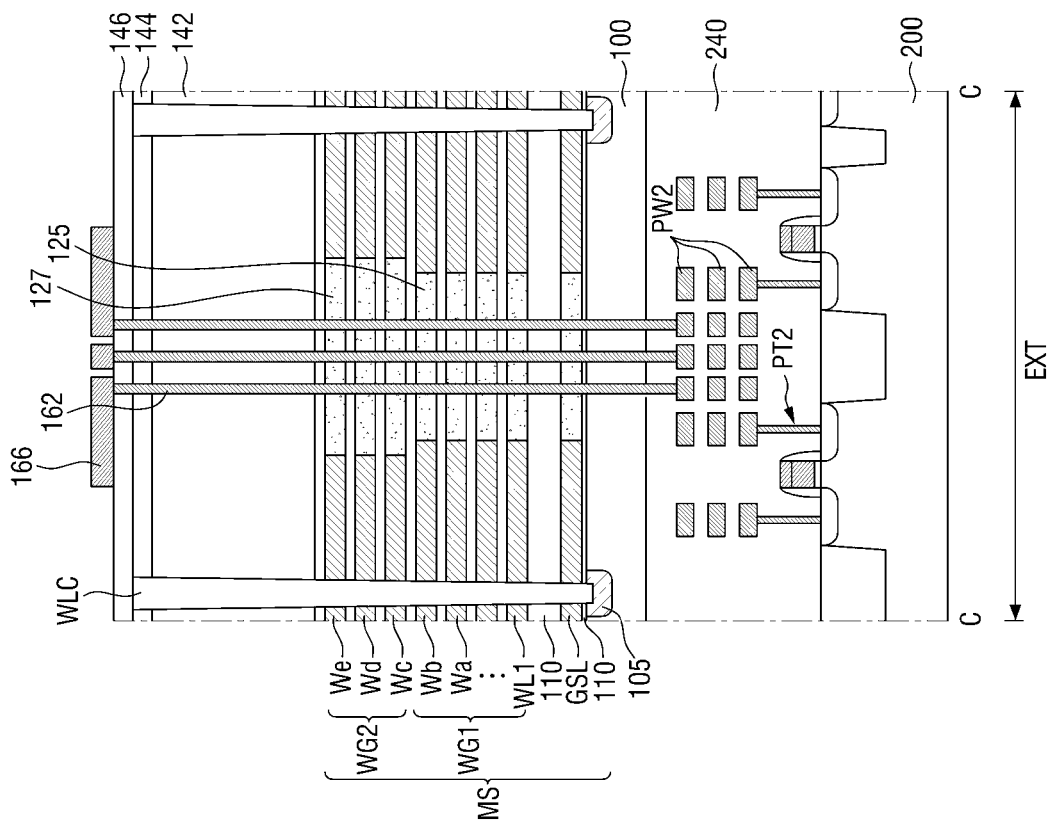
FIG. 9 is a cross-sectional view taken along line C-C of FIG. 3.

FIG. 3 is a layout diagram illustrating a semiconductor memory device according to some embodiments. FIG. 4 is a cross-sectional view taken along line A-A of FIG. 3. FIGS. 5A and 5B are various enlarged views of region R1 of FIG. 4. FIGS. 6A through 6E are various enlarged views of region R2 of FIG. 4. FIGS. 7A and 7B are various enlarged views of region R3 of FIG. 4. FIG. 8 is a cross-sectional view taken along line B-B of FIG. 3. FIG. 9 is a cross-sectional view taken along line C-C of FIG. 3.

Referring to FIGS. 3 to 9, a semiconductor memory device according to some embodiments may include a cell array region CELL and an extension region EXT.

The cell array region CELL and the extension region EXT may be cut by a plurality of block separation areas WLC to form a plurality of memory cell blocks (e.g., BLK1 to BLKn in FIG. 1). For example, as illustrated in FIG. 3, the block separation areas WLC may extend in a second direction Y to cut the cell array region CELL and the extension region EXT.

A memory cell array (e.g., 20 in FIG. 1) including a plurality of memory cells may be formed in the cell array region CELL. For example, a channel structure CH to be described later, a bit line BL, and the like may be formed in the cell array region CELL.

The extension region EXT may be disposed around the cell array region CELL. In some embodiments, the cell array region CELL and the extension region EXT may be arranged along an extending direction of the block separation areas WLC. For example, the cell array region CELL and the extension region EXT may be arranged along the second direction Y. A plurality of gate electrodes GSL, WL1 to WLn, and SSL, which will be described later, may be stacked in a stepped shape in the extension region EXT.

The extension region EXT may include contact areas CNR and pad areas PAD. The contact areas CNR and the pad areas PAD may be alternately arranged along the extending direction of the block separation areas WLC. For example, the contact areas CNR and the pad areas PAD may be alternately arranged along the second direction Y. A gate contact (e.g., 164 in FIG. 4) connected to each of the gate electrodes GSL, WL1 to WLn, and SSL may be formed in the contact area CNR. In FIG. 3, only one pad area PAD is illustrated in the extension region EXT, but this is only for simplicity of description, and of course, a plurality of pad areas PAD may be formed in the extension region EXT.

In some embodiments, a protruding length of a gate electrode in the pad area PAD may be longer than a protruding length of a gate electrode in the contact area CNR. For example, as illustrated in FIG. 4, a protruding length of a gate electrode (e.g., We) exposed in the pad area PAD from a gate electrode (e.g., Wf) thereon may be longer than a protruding length of a gate electrode (e.g., Wd) exposed in the contact area CNR from a gate electrode (e.g., We) thereon.

The semiconductor memory device according to some embodiments may include a first substrate 100, a mold structure MS, a channel structure CH, a bit line BL, a block separation area WLC, a cell gate cutting area CAC, and an extension gate cutting area CNC, a first insulating pattern 120 and 122, a first through via 152, a gate contact 164, a second insulating pattern 125 and 127 and a second through via 162.

The first substrate 100 may include, for example, a semiconductor substrate such as a silicon substrate, a germanium substrate, or a silicon-germanium substrate. Alternatively, the first substrate 100 may include a silicon-on-insulator (SOI) substrate or a germanium-on-insulator (GOI) substrate.

In some embodiments, the first substrate 100 may include an impurity area 105. The impurity area 105 may extend in the second direction Y and be provided as a common source line (e.g., CSL in FIG. 2) of the semiconductor memory device.

The mold structure MS may be formed in the cell array region CELL and the extension region EXT. In the extension region EXT, the mold structure MS may be formed in a stepped shape along the second direction Y.

The mold structure MS may be formed on the first substrate 100. The mold structure MS may include the plurality of gate electrodes GSL, WL1 to WLn, and SSL and a plurality of mold insulating films 110 which are alternately stacked on the first substrate 100. For example, each of the gate electrodes GSL, WL1 to WLn, and SSL and each of the mold insulating films 110 may have a layered structure extending in the first direction X and the second direction Y. The gate electrodes GSL, WL1 to WLn, and SSL and the mold insulating films 110 may be alternately stacked in a third direction Z perpendicular to a top surface of the first substrate 100. Accordingly, the plurality of gate electrodes GSL, WL1 to WLn, and SSL may be spaced apart from each other and be stacked on the first substrate 100.

In some embodiments, the gate electrodes GSL, WL1 to WLn, and SSL may include a ground select line GSL, a plurality of word lines WL1 to WLn, and a string select line SSL which are sequentially stacked on the first substrate 100. In some embodiments, the ground select line GSL may be a gate electrode disposed at the bottom of the plurality of gate electrodes GSL, WL1 to WLn, and SSL. Further, in some embodiments, the string select line SSL may be a gate electrode disposed at the top of the plurality of gate electrodes GSL, WL1 to WLn, and SSL.

The mold structure MS is shown to include only one ground select line GSL and one string select line SSL, but this is merely an example. For example, the mold structure MS may include a plurality of ground select lines GSL or a plurality of string select lines SSL.

The gate electrodes GSL, WL1 to WLn, and SSL may include a first word line group WG1, and a second word line group WG2 stacked on the first word line group WG1. For example, the first word line group WG1 may include some (e.g., WL1 to Wb) of the gate electrodes GSL, WL1 to WLn, and SSL, and the second word line group WG2 may include others (e.g., We to WLn) of the gate electrodes GSL, WL1 to WLn, and SSL.

The gate electrodes GSL, WL1 to WLn, and SSL may include, for example, metal such as tungsten (W), cobalt (Co), and nickel (Ni), or a semiconductor material such as silicon, but are not limited thereto. The gate electrodes GSL, WL1 to WLn, and SSL may be formed by, for example, a replacement process, but are not limited thereto.

The mold insulating film 110 may include an insulating material. For example, the mold insulating film 110 may include oxide (e.g., silicon oxide), but is not limited thereto.

The channel structure CH may penetrate the mold structure MS. Further, the channel structure CH may extend in a direction crossing the plurality of gate electrodes GSL, WL1 to WLn, and SSL. For example, the channel structure CH may have a pillar shape (e.g., a cylindrical shape) extending in the third direction Z. In some embodiments, the channel structure CH may cross (e.g., extend vertically in the third direction Z through) a respective level (or "height") of each of the plurality of gate electrodes GSL, WL1 to WLn, and SSL. Furthermore, as shown in FIG. 5A, the channel structure CH may include a semiconductor pattern 130 and an information storage film 132.

The channel structure CH is shown to be formed only in the mold structure MS of the cell array region CELL, but this is merely for simplicity of description. For example, in order to reduce stress applied to the mold structure MS, a dummy channel structure having a shape similar to the channel structure CH may be formed in the mold structure MS of the extension region EXT.

The semiconductor pattern 130 may extend in the third direction Z to penetrate the mold structure MS. The semiconductor pattern 130 is shown in a cup shape, but this is merely an example. For example, the semiconductor pattern 130 may have various shapes such as a cylindrical shape, a rectangular tube shape, and a solid pillar shape.

The semiconductor pattern 130 may include, for example, a semiconductor material such as monocrystalline silicon, polycrystalline silicon, organic semiconductor material, and carbon nanostructure, but is not limited thereto.

The information storage film 132 may be interposed between the semiconductor pattern 130 and each of the gate electrodes GSL, WL1 to WLn, and SSL. For example, the information storage film 132 may extend along a side surface of the semiconductor pattern 130.

The information storage film 132 may include, for example, at least one of silicon oxide, silicon nitride, silicon oxynitride, or a high dielectric constant material having a higher dielectric constant than silicon oxide. The high dielectric constant material may include, for example, at least one selected from the group consisting of aluminum oxide, hafnium oxide, lanthanum oxide, tantalum oxide, titanium oxide, lanthanum hafnium oxide, lanthanum aluminum oxide, dysprosium scandium oxide and a combination thereof.

In some embodiments, the information storage film 132 may be formed of multiple films. For example, the information storage film 132 may include a tunnel insulating film 132a, a charge storage film 132b, and a blocking insulating film 132c which are sequentially stacked on the semiconductor pattern 130.

The tunnel insulating film 132a may include, for example, silicon oxide or a high dielectric constant material (e.g., aluminum oxide ($Al_2O_3$) or hafnium oxide ($HfO_2$)) having a higher dielectric constant than silicon oxide. The charge storage film 132b may include, for example, silicon nitride.

The blocking insulating film 132c may include, for example, silicon oxide or a high dielectric constant material (e.g., aluminum oxide ($Al_2O_3$) or hafnium oxide ($HfO_2$)) having a higher dielectric constant than silicon oxide.

In some embodiments, the channel structure CH may further include a filling pattern 134. The filling pattern 134 may be formed to fill an interior of the semiconductor pattern 130 having a cup shape. For example, the semiconductor pattern 130 may extend along side and bottom surfaces of the filling pattern 134. The filling pattern 134 may include an insulating material, e.g., silicon oxide, but is not limited thereto.

In some embodiments, each channel structure CH may further include a channel pad 136. The channel pad 136 may be formed to be connected to an upper portion of the semiconductor pattern 130. For example, the channel pad 136 may be formed in the mold insulating film 110 on the uppermost gate electrode (e.g., the string select line SSL) and connected to the semiconductor pattern 130. The channel pad 136 may include, for example, polysilicon doped with impurities, but is not limited thereto.

In some embodiments, a plurality of channel structures CH may be arranged in a zigzag shape. For example, as illustrated in FIG. 3, the plurality of channel structures CH may be alternately arranged in the first direction X and the second direction Y. The plurality of channel structures CH arranged in a zigzag shape can further improve the integration density of the semiconductor memory device.

Referring to FIGS. 4 and 5B, the semiconductor memory device according to some embodiments may further include a source structure 300.

The source structure 300 may be formed on the first substrate 100. In some embodiments, the source structure 300 may be interposed between the first substrate 100 and the mold structure MS. The source structure 300 may include, for example, metal or polysilicon doped with impurities.

In some embodiments, the channel structure CH may penetrate the source structure 300 and be connected to the first substrate 100. For example, a lower portion of the channel structure CH may penetrate the source structure 300 and be embedded in the first substrate 100. The source structure 300 may be formed to be connected to the semiconductor pattern 130 of the channel structure CH. For example, the source structure 300 may penetrate a part of the information storage film 132 and be connected to the semiconductor pattern 130.

In some embodiments, a portion of the source structure 300 adjacent to the semiconductor pattern 130 may have a shape protruding toward the information storage film 132. For example, in a region adjacent to the semiconductor pattern 130, an extending length of the source structure 300 in the third direction Z may get longer. This may be due to characteristics of an etching process in which a portion of the information storage film 132 is removed to form the source structure 300.

The bit line BL may be formed on the mold structure MS. For example, the bit line BL may be formed on first to third interlayer insulating films 142, 144, and 146 that are sequentially stacked on the mold structure MS.

The bit line BL may extend in the first direction X and be connected to the plurality of channel structures CH. For example, as illustrated in FIG. 4, the bit line BL may be connected to the plurality of channel structures CH through bit line contacts 170. The bit line contacts 170 may, for example, penetrate the first to third interlayer insulating films 142, 144, and 146 to electrically connect the bit line BL to the channel structures CH.

The block separation area WLC may be formed in the cell array region CELL and the extension region EXT to cut the plurality of gate electrodes GSL, WL1 to WLn, and SSL. Further, the block separation area WLC may extend in a direction crossing the bit line BL. For example, a plurality of block separation areas WLC may be arranged along the first direction X in the cell array region CELL and the extension region EXT. Each block separation area WLC may extend in the second direction Y to cut the mold structure MS.

As described above in FIG. 3, the block separation area WLC may cut the cell array region CELL and the extension region EXT to form a plurality of memory cell blocks BLK1 to BLKn. For example, each block separation area WLC may extend in the second direction Y to completely cut the mold structure MS. As used herein, the term "completely cut" may refer to a cut that extends continuously from a first horizontal boundary of the mold structure MS to an opposite horizontal boundary of the mold structure MS, and/or that extends continuously from a top of the mold structure MS to a bottom of the mold structure MS. The mold structure MS cut by two adjacent block separation areas WLC may define one of block areas BLK1 to BLKn.

The cell gate cutting area CAC may be formed in the cell array region CELL to cut the plurality of gate electrodes GSL, WL1 to WLn, and SSL. Further, the cell gate cutting area CAC may extend in a direction crossing the bit line BL. For example, a plurality of cell gate cutting areas CAC may be arranged in the cell array region CELL along the first direction X. Each of the cell gate cutting areas CAC may extend in the second direction Y to cut the mold structure MS in the cell array region CELL.

The cell gate cutting area CAC may form a plurality of zones I, II, and III in one of the block areas BLK1 to BLKn of the cell array region CELL. For example, as illustrated in FIG. 3, two cell gate cutting areas CAC may be formed within two adjacent block separation areas WLC. Accordingly, three zones (e.g., first to third zones I, II, and III) may be formed in the two adjacent block separation areas WLC.

The extension gate cutting area CNC may be formed in the extension region EXT to cut the plurality of gate electrodes GSL, WL1 to WLn, and SSL. Further, the extension gate cutting area CNC may extend in a direction crossing the bit line BL. For example, a plurality of extension gate cutting areas CN may be arranged in the extension region EXT along the first direction X. Each of the extension gate cutting areas CNC may extend in the second direction Y to cut the mold structure MS in the extension region EXT.

In some embodiments, at least a portion of the extension gate cutting area CNC may be arranged to overlap the cell gate cutting area CAC in the second direction Y. For example, as illustrated in FIG. 3, two extension gate cutting areas CNC may be formed in two adjacent block separation areas WLC. In some embodiments, the two extension gate cutting areas CNC may overlap the cell gate cutting areas CAC in the second direction Y.

It is illustrated that all the extension gate cutting areas CNC overlap the cell gate cutting areas CAC in the second direction Y, but this is merely an example. For example, some of the extension gate cutting areas CNC may be arranged to overlap cutting structures SC to be described later in the second direction Y. In some embodiments, the extension gate cutting area CNC may be formed in the contact area CNR of the extension region EXT.

The block separation area WLC, the cell gate cutting area CAC, and the extension gate cutting area CNC may include, for example, at least one of silicon oxide, silicon nitride, silicon oxynitride, and a low dielectric constant (low-k) material having a lower dielectric constant than silicon oxide, but are not limited thereto.

In some embodiments, the block separation area WLC, the cell gate cutting area CAC, and the extension gate cutting area CNC may be formed at the same level. The term "formed at the same level" as used herein means being formed by the same manufacturing process. For example, insulating materials constituting the block separation area WLC, the cell gate cutting area CAC, and the extension gate cutting area CNC may be identical to each other.

In some embodiments, the block separation area WLC may include a conductive material. For example, the block separation area WLC may include a conductive pattern and a spacer that separates the mold structure MS from the conductive pattern. The block separation area WLC including the conductive pattern may be connected to the impurity area 105 to be provided as a common source line (e.g., CSL in FIG. 2) of the semiconductor memory device.

In some embodiments, a cutting structure SC may be formed in the mold structure MS of the cell array region CELL. The cutting structure SC may be interposed between the block separation areas WLC to cut the string select line SSL of the mold structure MS. For example, a plurality of cutting structures SC may be arranged in the cell array region CELL along the first direction X. Each of the cutting structures SC may extend in the second direction Y to cut the string select line SSL.

In some embodiments, some of the cutting structures SC may be arranged to overlap the cell gate cutting areas CAC. For example, the cutting structures SC may be formed between the first zone I and the second zone II and between the second zone II and the third zone III. The cutting structures SC that are arranged to overlap the cell gate cutting areas CAC may form the plurality of zones I, II, and III in one of the block areas BLK1 to BLKn together with the cell gate cutting areas CAC.

Accordingly, the string select line SSL of the first zone I and the string select line SSL of the second zone II may be electrically separated and controlled separately. Further, the string select line SSL of the second zone II and the string select line SSL of the third zone III may be electrically separated and controlled separately.

In some embodiments, others of the cutting structures SC may be interposed between the block separation area WLC and the cell gate cutting area CAC. For example, the cutting structures SC may be formed to cut the first to third zones I, II, and III, respectively. Accordingly, each of the first to third zones I, II, and III may provide two string select lines SSL that are electrically separated and controlled separately. That is, six string select lines SSL may, in some embodiments, be formed within two adjacent block separation areas WLC.

A plurality of first insulating patterns 120 and 122 may be formed in the mold structure MS of the cell array region CELL. The plurality of first insulating patterns 120 and 122 may be spaced apart from each other and stacked on the first substrate 100. For example, each of the first insulating patterns 120 and 122 may have a layered structure extending in the first direction X and the second direction Y.

The plurality of first insulating patterns 120 and 122 may be stacked at the same level as at least some of the plurality of gate electrodes GSL, WL1 to WLn, and SSL. The term "stacked at the same level" as used herein means being formed at substantially the same height with respect to a top surface of the first substrate 100. For example, the first insulating patterns 120 and 122 may include a plurality of first insulating lines 120 that are each formed at the same height as the first word line group WG1. Further, the first insulating patterns 120 and 122 may include second insulating lines 122 that are each formed at the same height as the second word line group WG2.

The first insulating patterns 120 and 122 may be alternately stacked with at least some of the mold insulating films 110 in the cell array region CELL. That is, the first insulating patterns 120 and 122 may cut the gate electrodes GSL, WL1 to WLn, and SSL of the cell array region CELL.

The first insulating patterns 120 and 122 may include an insulating material different from the mold insulating film 110. For example, when the mold insulating film 110 includes oxide (e.g., silicon oxide), the first insulating patterns 120 and 122 may include nitride (e.g., silicon nitride).

In some embodiments, the first insulating line 120 and the second insulating line 122 may include different materials from each other. For example, when the first insulating patterns 120 and 122 include nitride (e.g., silicon nitride), the first insulating line 120 may have a nitrogen ratio different from the second insulating line 122.

The first through via 152 may be formed in the first insulating patterns 120 and 122 in a plan view. The first through via 152 may penetrate the mold structure MS and the first substrate 100. For example, the first through via 152 may extend in the third direction Z to penetrate the plurality of mold insulating films 110 and the plurality of first insulating patterns 120 and 122.

In some embodiments, the first through via 152 may be connected to the bit line BL. For example, as illustrated in FIGS. 4 and 8, the first through via 152 may penetrate the first to third interlayer insulating films 142, 144, and 146 and be connected to the bit line BL. Accordingly, the bit line BL may connect the first through via 152 to the channel structure CH.

In some embodiments, a second substrate 200 and a first peripheral circuit element PT1 may be formed under the first substrate 100.

The second substrate 200 may include, for example, a semiconductor substrate such as a silicon substrate, a germanium substrate, or a silicon-germanium substrate. Alternatively, the second substrate 200 may include a silicon-on-insulator (SOI) substrate or a germanium-on-insulator (GOI) substrate.

The first peripheral circuit element PT1 may be formed on the second substrate 200 of the cell array region CELL. The first peripheral circuit element PT1 may constitute a peripheral circuit (e.g., 30 in FIG. 1) that controls an operation of each memory cell. For example, the first peripheral circuit element PT1 may include a page buffer (e.g., 35 in FIG. 1), a control logic (e.g., 37 in FIG. 1), and the like.

The first peripheral circuit element PT1 may include, for example, a transistor, but is not limited thereto. For example, the first peripheral circuit element PT1 may include various active elements such as a transistor, as well as various passive elements such as a capacitor, a resistor, and an inductor.

In some embodiments, the first through via 152 may be connected to the first peripheral circuit element PT1. For example, a fourth interlayer insulating film 240 on (e.g., covering) the first peripheral circuit element PT1 may be formed on the second substrate 200 and a first peripheral circuit wiring PW1 may be formed in the fourth interlayer insulating film 240. The first through via 152 may be connected to the first peripheral circuit element PT1 through the first peripheral circuit wiring PW1.

In some embodiments, a separation distance of the first word line group WG1 from the first through via 152 may be different from a separation distance of the second word line group WG2 from the first through via 152. For example, as illustrated in FIG. 6A, the first word line group WG1 may include first and second word lines Wa and Wb that are sequentially stacked on the first substrate 100 and spaced at the same distance from the first through via 152. In addition, the second word line group WG2 may include third to sixth word lines Wc to Wf that are sequentially stacked on the first word line group WG1 and spaced at the same distance from the first through via 152. The term "same" as used herein not only means being completely identical but also includes a minute difference that may occur due to a process margin and the like.

At this time, a first distance DT1 from the first word line group WG1 to the first through via 152 may be different from a second distance DT2 from the second word line group WG2 to the first through via 152. For example, the first distance DT1 from a first boundary surface IS1, formed by the first word line Wa and the first insulating line 120, to the first through via 152 may be different from the second distance DT2 from a second boundary surface IS2, formed by the third word line Wc and the second insulating line 122, to the first through via 152.

In some embodiments, the first distance DT1 may be smaller than the second distance DT2. Accordingly, a length (e.g., DT1) of the first insulating lines 120 interposed between the first word line group WG1 and the first through via 152 may be smaller than a length (e.g., DT2) of the second insulating lines 122 interposed between the second word line group WG2 and the first through via 152.

In some embodiments, a thickness of the first insulating line 120 may be equal to a thickness of the first word line Wa, and a thickness of the second insulating line 122 may be equal to a thickness of the third word line Wc. The thicknesses may be in the third direction Z.

Referring again to FIG. 4, the gate contact 164 may be formed in the extension region EXT. The gate contact 164 may be connected to each of the gate electrodes GSL, WL1 to WLn, SSL. For example, the gate contact 164 may pass through the first to third interlayer insulating films 142, 144, and 146 to be connected to each of the gate electrodes GSL, WL1 to WLn, and SSL.

In some embodiments, the gate contact 164 may be formed in the contact area CNR of the extension region EXT. For example, as illustrated in FIG. 4, the gate electrodes (e.g., Wb to Wd, Wf, and Wg) exposed in the contact area CNR may be arranged in (e.g., may collectively have) a stepped shape. The gate contact 164 may be connected to one end of each of the gate electrodes (e.g., Wb to Wd, Wf, and Wg) exposed in a stepped shape in the contact area CNR.

A plurality of second insulating patterns 125 and 127 may be formed in the mold structure MS of the extension region EXT. The plurality of second insulating patterns 125 and 127 may be spaced apart from each other and stacked on the first substrate 100. For example, each of the second insulating patterns 125 and 127 may have a layered structure extending in the first direction X and the second direction Y.

The plurality of second insulating patterns 125 and 127 may be stacked at the same level as at least some of the plurality of gate electrodes GSL, WL1 to WLn, and SSL. For example, the second insulating patterns 125 and 127 may include a plurality of third insulating lines 125 that are each formed at the same height as the first word line group WG1. Further, the second insulating patterns 125 and 127 may include fourth insulating lines 127 that are each formed at the same height as the second word line group WG2.

The second insulating patterns 125 and 127 may be alternately stacked with at least some of the mold insulating films 110 of the extension region EXT. That is, the second insulating patterns 125 and 127 may cut some (GSL, WL1 to Wc) of the gate electrodes GSL, WL1 to WLn, and SSL in the extension region EXT.

The second insulating patterns 125 and 127 may include an insulating material different from the mold insulating film 110. For example, when the mold insulating film 110 includes oxide (e.g., silicon oxide), the second insulating patterns 125 and 127 may include nitride (e.g., silicon nitride).

In some embodiments, the third insulating line 125 and the fourth insulating line 127 may include different materials from each other. For example, when the second insulating patterns 125 and 127 include nitride (e.g., silicon nitride), the third insulating line 125 may have a nitrogen ratio different from the fourth insulating line 127.

In some embodiments, insulating materials constituting the first insulating line 120 and the third insulating line 125 may be identical to each other. In addition, insulating materials constituting the second insulating line 122 and the fourth insulating line 127 may be identical to each other.

The second through via 162 may be formed in the second insulating patterns 125 and 127 in a plan view. The second through via 162 may penetrate the mold structure MS and the first substrate 100. For example, the second through via 162 may extend in the third direction Z to penetrate the plurality of mold insulating films 110 and the plurality of second insulating patterns 125 and 127.

In some embodiments, the second through via 162 may be connected to the gate contact 164. For example, as illustrated in FIGS. 4 and 9, a connection wiring 166 may be formed on the third interlayer insulating film 146. The gate contact 164 and the second through via 162 may each pass through the first to third interlayer insulating films 142, 144, and 146 to be connected to the connection wiring 166. Accordingly, the connection wiring 166 may connect the gate contact 164 to the second through via 162.

In some embodiments, a second peripheral circuit element PT2 may be formed on the second substrate 200 of the extension region EXT. The second peripheral circuit element PT2 may constitute a peripheral circuit (e.g., 30 in FIG. 1) that controls an operation of each memory cell. For example, the second peripheral circuit element PT2 may include a row decoder (e.g., 33 in FIG. 1), a control logic (e.g., 37 in FIG. 1), and the like.

The second peripheral circuit element PT2 may include, for example, a transistor, but is not limited thereto. For example, the second peripheral circuit element PT2 may include various active elements such as a transistor, as well as various passive elements such as a capacitor, a resistor, and an inductor.

In some embodiments, the second through via 162 may be connected to the second peripheral circuit element PT2. For example, a second peripheral circuit wiring PW2 may be formed in the fourth interlayer insulating film 240. The second through via 162 may be connected to the second peripheral circuit element PT2 through the second peripheral circuit wiring PW2.

In some embodiments, a separation distance of the first word line group WG1 from the second through via 162 may be different from a separation distance of the second word line group WG2 from the second through via 162. For example, a third distance DT3 from a third boundary surface IS3, formed by the first word line Wa and the third insulating line 125, to the second through via 162 may be different from a fourth distance DT4 from a fourth boundary surface IS4, formed by the third word line Wc and the fourth insulating line 127, to the second through via 162.

In some embodiments, the third distance DT3 may be smaller than the fourth distance DT4. Accordingly, a length (e.g., DT3) of the third insulating lines 125 interposed between the first word line group WG1 and the second through via 162 may be smaller than a length (e.g., DT4) of the fourth insulating lines 127 interposed between the second word line group WG2 and the second through via 162.

In some embodiments, a thickness of the third insulating line 125 may be equal to a thickness of the first word line Wa, and a thickness of the fourth insulating line 127 may be equal to a thickness of the third word line Wc. The thicknesses may be in the third direction Z.

Figure 6B:
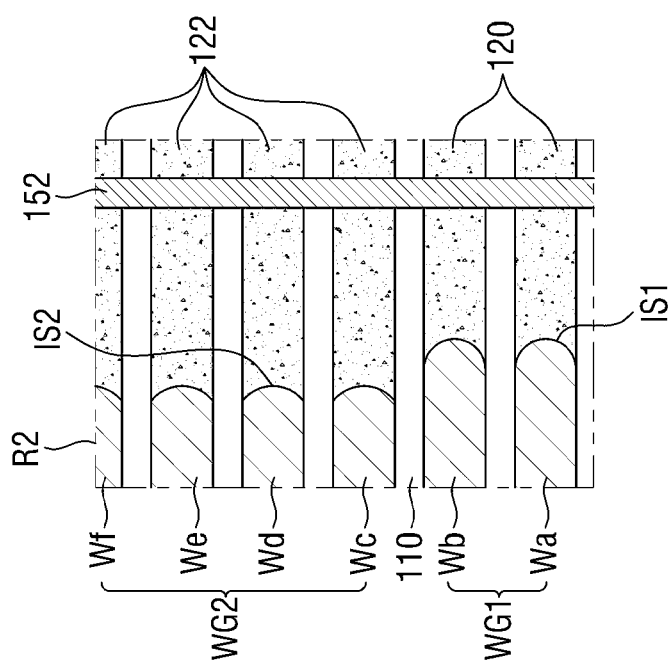

Referring to FIGS. 4 and 6B, in the semiconductor memory device according to some embodiments, the first boundary surface IS1 or the second boundary surface IS2 may have a convex shape toward the first insulating patterns 120 and 122.

In FIG. 6B, both the first boundary surface IS1 and the second boundary surface IS2 have convex shapes. However, this is merely an example and only one of the first boundary surface IS1 and the second boundary surface IS2 may have a convex shape. In addition, although not shown, the third boundary surface IS3 or the fourth boundary surface IS4 may, in some embodiments, have a convex shape toward the second insulating patterns 125 and 127.

In some embodiments, a radius of curvature of the first boundary surface IS1 and a radius of curvature of the second boundary surface IS2 may be different from each other. This may be due to characteristics of an etching process for forming the first insulating line 120 and the second insulating line 122, but is not limited thereto.

Figure 6C:
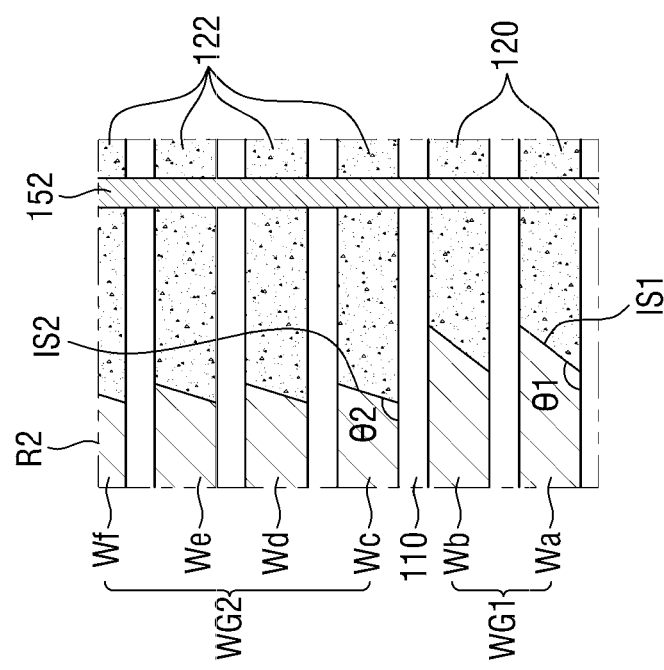

Referring to FIGS. 4 and 6C, in the semiconductor memory device according to some embodiments, the first boundary surface IS1 or the second boundary surface IS2 may be inclined toward the first insulating patterns 120 and 122.

For example, the first boundary surface IS1 and a bottom surface of the first word line Wa may form a first obtuse angle θ1, and the second boundary surface IS2 and a bottom surface of the third word line Wc may form a second obtuse angle θ2.

In FIG. 6C, both the first boundary surface IS1 and the second boundary surface IS2 are inclined. However, this is merely an example and only one of the first boundary surface IS1 and the second boundary surface IS2 may be inclined. In addition, although not shown, the third boundary surface IS3 and/or the fourth boundary surface IS4 may, in some embodiments, be inclined toward the second insulating patterns 125 and 127.

In some embodiments, the first obtuse angle θ1 of the first boundary surface IS1 and the second obtuse angle θ2 of the second boundary surface IS2 may be different from each other. This may be due to characteristics of an etching process for forming the first insulating line 120 and the second insulating line 122, but is not limited thereto.

Figure 6D:
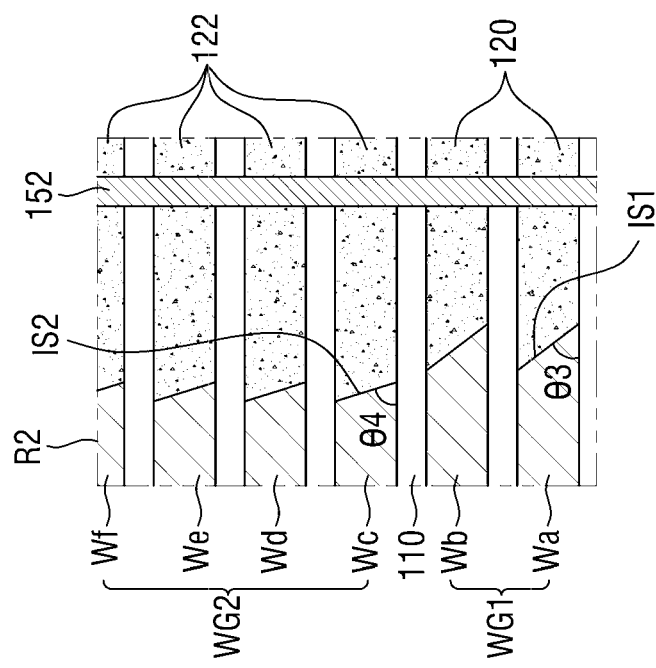

Referring to FIGS. 4 and 6D, in the semiconductor memory device according to some embodiments, the first boundary surface IS1 or the second boundary surface IS2 may be inclined toward the gate electrodes GSL, WL1 to WLn, and SSL.

For example, the first boundary surface IS1 and the bottom surface of the first word line Wa may form a first acute angle θ3, and the second boundary surface IS2 and the bottom surface of the third word line Wc may form a second acute angle θ4.

In FIG. 6D, both the first boundary surface IS1 and the second boundary surface IS2 are inclined. However, this is merely an example, and only one of the first boundary surface IS1 and the second boundary surface IS2 may be inclined. In addition, although not illustrated, the third boundary surface IS3 and/or the fourth boundary surface IS4 may, in some embodiments, be inclined toward the gate electrodes GSL, WL1 to WLn, and SSL.

In some embodiments, the first acute angle θ3 of the first boundary surface IS1 and the second acute angle θ4 of the second boundary surface IS2 may be different from each other. This may be due to characteristics of an etching process for forming the first insulating line 120 and the second insulating line 122, but is not limited thereto.

Figure 6E:
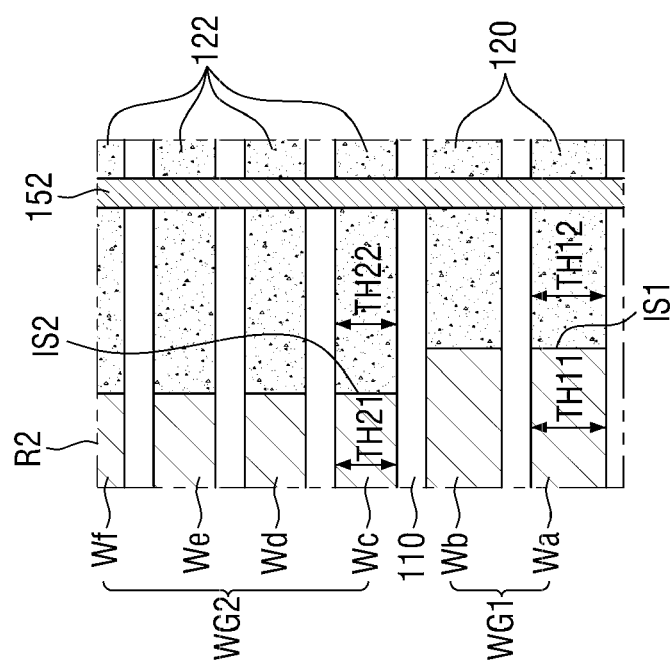

Referring to FIGS. 4 and 6E, in the semiconductor memory device according to some embodiments, a thickness of the first word line group WG1 may be greater than a thickness of the second word line group WG2.

For example, a thickness TH11 of the first word line Wa may be greater than a thickness TH21 of the third word line Wc. Accordingly, a thickness TH12 of the first insulating line 120 may be greater than a thickness TH22 of the second insulating line 122. Although not illustrated, a thickness of the third insulating line 125 may be greater than a thickness of the fourth insulating line 127.

Referring to FIGS. 4 and 7B, in the semiconductor memory device according to some embodiments, a gate electrode (e.g., We) exposed in the pad area PAD may have a large thickness in an area exposed from/by a gate electrode (e.g., Wf) thereon.

For example, a thickness TH32 of the fifth word line We in a portion exposed from/by the sixth word line Wf may be greater than a thickness TH31 of the fifth word line We in a portion overlapping the sixth word line Wf. Accordingly, a thickness TH33 of the fourth insulating line 127 stacked on the same level as the fifth word line We may be greater than the thickness TH31 of the fifth word line We in the portion overlapping the sixth word line Wf. In this case, damage to the fifth word line We due to the gate contact 164 can be effectively impeded/prevented.

A semiconductor memory device including a through via may have a problem in that reliability of a product is deteriorated due to stress applied to a mold structure. For example, the through via (e.g., the first through via 152 and the second through via 162) penetrating the mold structure MS may apply stress to the mold structure MS, which can cause deterioration of product reliability.

However, as described above, in the semiconductor memory device according to some embodiments, the first through via 152 may be formed in the first insulating patterns 120 and 122, and the second through via 162 may be formed in the second insulating patterns 125 and 127. The first insulating patterns 120 and 122 and the second insulating patterns 125 and 127 may be alternately stacked with the mold insulating films 110 similarly to the gate electrodes GSL, WL1 to WLn, and SSL. Accordingly, the semiconductor memory device according to some embodiments reduces/minimizes deformation of the mold structure MS and reduces stress applied to the mold structure MS due to the first through via 152 and the second through via 162, thereby improving product reliability.

In addition, as described above, in the semiconductor memory device according to some embodiments, the gate electrodes GSL, WL1 to WLn, and SSL may include the first word line group WG1 and the second word line group WG2 that are spaced apart from the through via (the first through via 152 or the second through via 162) by different distances. The separation distance of each of the gate electrodes GSL, WL1 to WLn, and SSL from the through via (the first through via 152 or the second through via 162) may affect the stress applied to the mold structure MS. Accordingly, the semiconductor memory device according to some embodiments flexibly adjusts the stress applied to the mold structure MS, thereby further improving product reliability.

Figure 10:
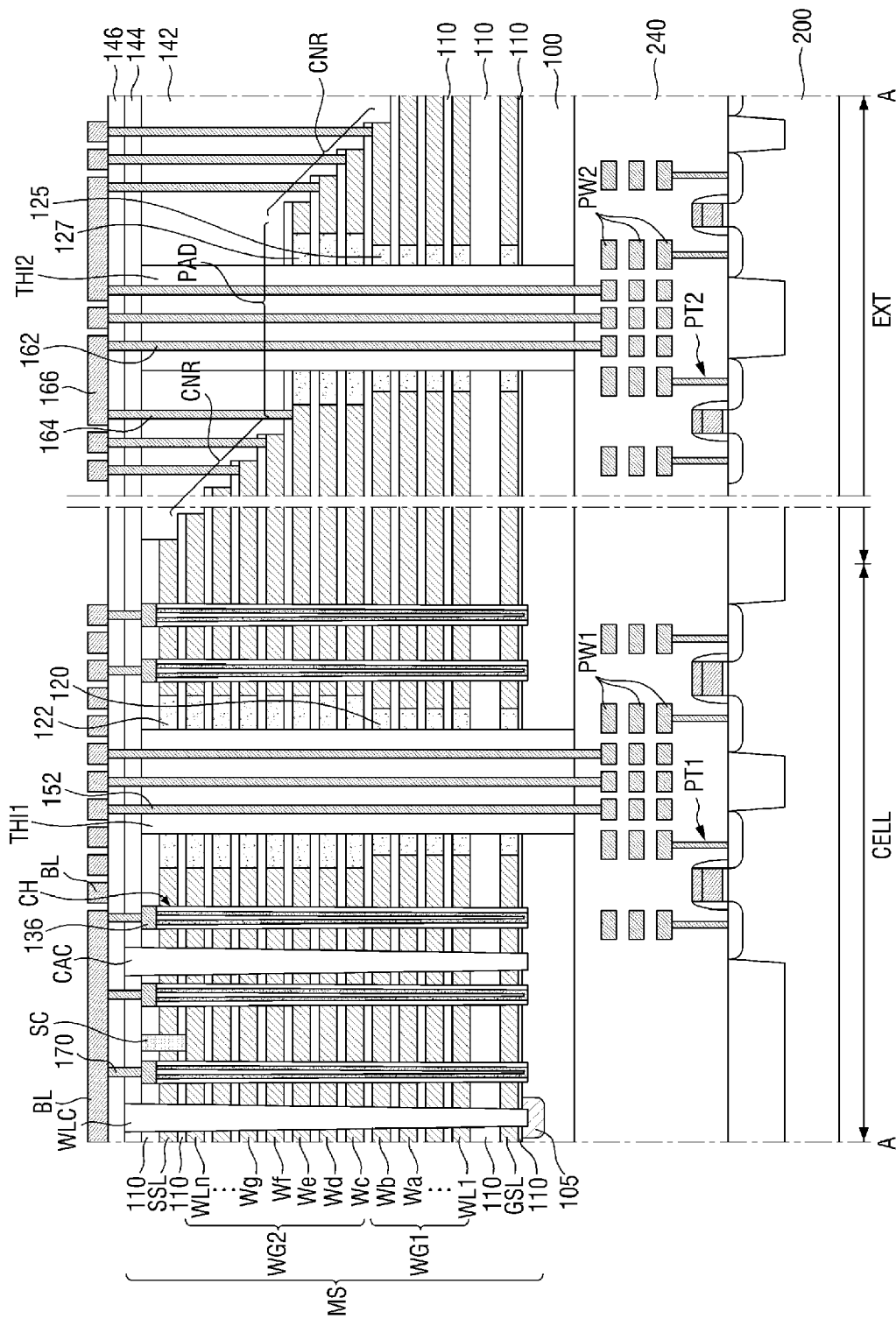
FIG. 10 is a cross-sectional view illustrating a semiconductor memory device according to some embodiments.

FIG. 10 is a cross-sectional view illustrating a semiconductor memory device according to some embodiments. For simplicity of description, a description overlapping with the description with reference to FIGS. 1 to 9 may be briefly given or omitted.

Referring to FIG. 10, the semiconductor memory device according to some embodiments further includes a first through insulator THI1 and a second through insulator THI2.

The first through insulator THI1 may be formed in the first insulating patterns 120 and 122 in a plan view. The first through insulator THI1 may penetrate the mold structure MS and the first substrate 100. For example, the first through insulator THI1 may extend in the third direction Z to penetrate the plurality of mold insulating films 110 and the plurality of first insulating patterns 120 and 122.

In some embodiments, the first through via 152 may be formed in the first through insulator THI1 in a plan view. The first through via 152 may penetrate the first through insulator THI1 and be connected to the first peripheral circuit element PT1.

The second through insulator THI2 may be formed in the second insulating patterns 125 and 127 in a plan view. The second through insulator THI2 may penetrate the first interlayer insulating film 142, the mold structure MS, and the first substrate 100. For example, the second through insulator THI2 may extend in the third direction Z to penetrate the plurality of mold insulating films 110 and the plurality of second insulating patterns 125 and 127.

In some embodiments, the second through via 162 may be formed in the second through insulator THI2 in a plan view. The second through via 162 may penetrate the second through insulator THI2 and be connected to the second peripheral circuit element PT2.

In some embodiments, the first through insulator THI1 and the second through insulator THI2 may include an insulating material having a lower dielectric constant than the first insulating patterns 120 and 122 and the second insulating patterns 125 and 127. For example, when the first insulating patterns 120 and 122 and the second insulating patterns 125 and 127 include nitride (e.g., silicon nitride), the first through insulator THI1 and the second through insulator THI2 may include oxide (e.g., silicon oxide). The first through insulator THI1 and the second through insulator THI2 may reduce leakage current caused by the first through via 152 and the second through via 162 to improve reliability of the semiconductor memory device.

Figure 11:
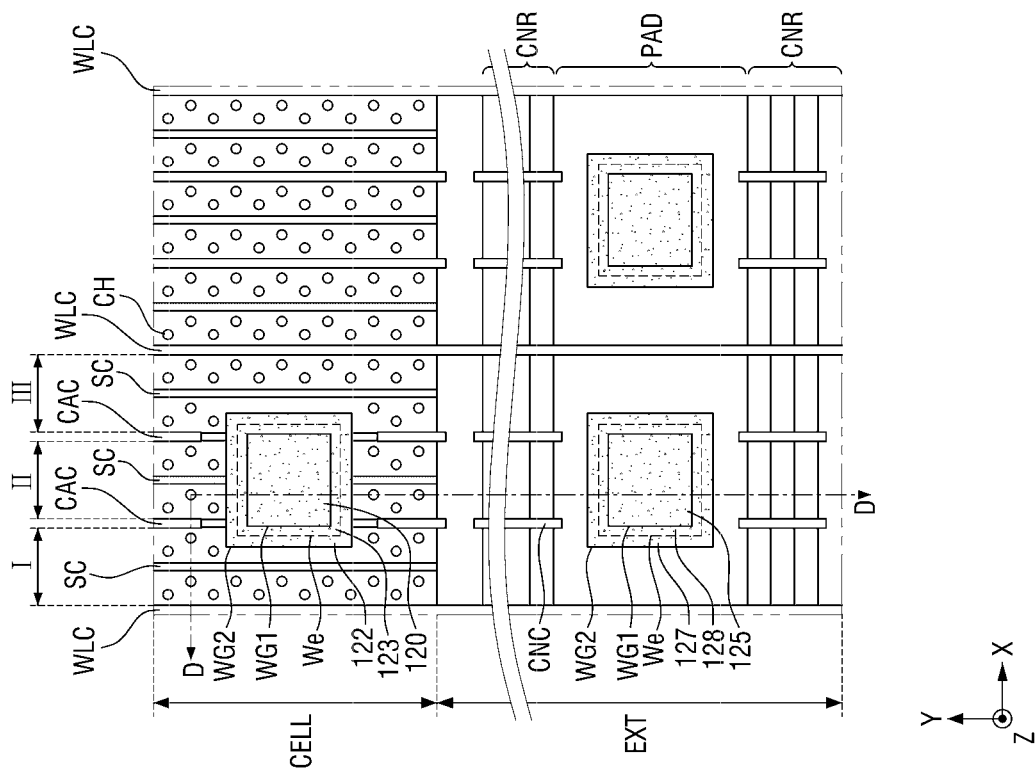
FIG. 11 is a layout diagram illustrating a semiconductor memory device according to some embodiments.
Figure 12:
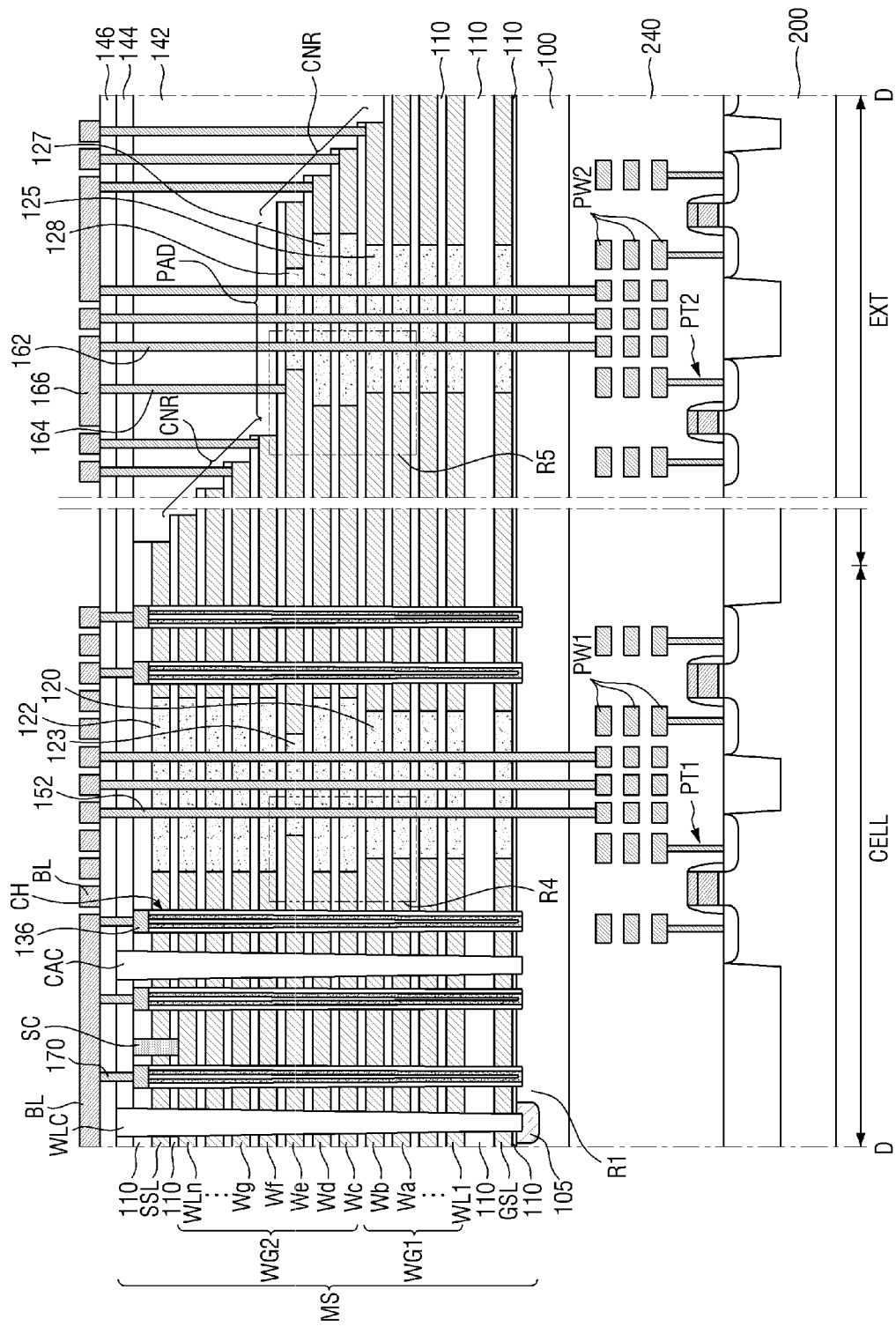
FIG. 12 is a cross-sectional view taken along line D-D of FIG. 11.
Figure 13:
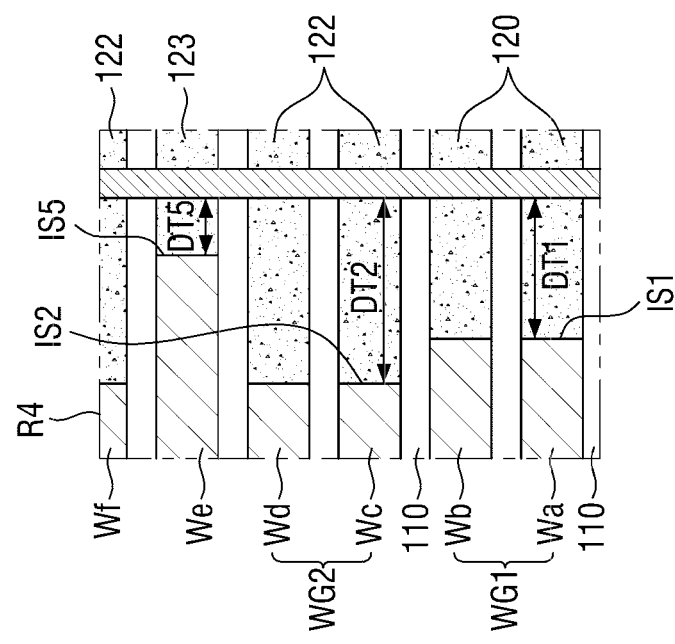
FIG. 13 is an enlarged view of region R4 of FIG. 12.
Figure 14:
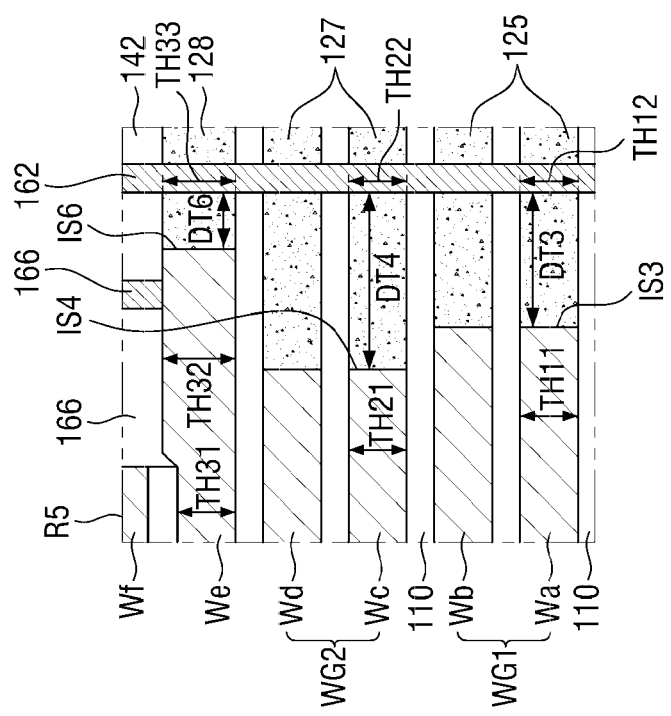
FIG. 14 is an enlarged view of region R5 of FIG. 12.

FIG. 11 is a layout diagram illustrating a semiconductor memory device according to some embodiments. FIG. 12 is a cross-sectional view taken along line D-D of FIG. 11. FIG. 13 is an enlarged view of region R4 of FIG. 12. FIG. 14 is an enlarged view of region R5 of FIG. 12. For simplicity of description, a description overlapping with the description with reference to FIGS. 1 to 9 may be briefly given or omitted.

Referring to FIGS. 11 to 14, in the semiconductor memory device according to some embodiments, a gate electrode (e.g., We) exposed in the pad area PAD may be closer to the first through via 152 and the second through via 162, compared to the first word line group WG1 and the second word line the group WG2.

For example, the gate electrodes GSL, WL1 to WLn, and SSL may include the fifth word line We exposed in the pad area PAD. The first insulating patterns 120 and 122 may include a fifth insulating line 123 stacked at the same level as the fifth word line We. In this case, as shown in FIG. 13, a fifth distance DT5 from the fifth word line We to the first through via 152 may be smaller than the first distance DT1 and the second distance DT2. That is, the fifth distance DT5 from a fifth boundary surface IS5, formed by the fifth word line We and the fifth insulating line 123, to the first through via 152 may be smaller than the first distance DT1 and the second distance DT2.

Further, the second insulating patterns 125 and 127 may include a sixth insulating line 128 stacked at the same level as the fifth word line We. In this case, as shown in FIG. 14, a sixth distance DT6 from the fifth word line We to the second through via 162 may be smaller than the third distance DT3 and the fourth distance DT4. That is, the sixth distance DT6 from a sixth boundary surface IS6, formed by the fifth word line We and the sixth insulating line 128, to the second through via 162 may be smaller than the third distance DT3 and the fourth distance DT4. In this case, a sufficient space for forming the gate contact 164 on the fifth word line We can be secured efficiently/effectively.

In some embodiments, a gate electrode (e.g., We) exposed in the pad area PAD may have a large thickness in an area exposed from/by a gate electrode (e.g., Wf) thereon. For example, a thickness TH32 of a portion of the fifth word line We that is exposed from/by the sixth word line Wf (e.g., a portion that does not have the sixth word line Wf thereon) may be greater than a thickness TH31 of another portion of the fifth word line We that is overlapped by the sixth word line Wf.

Figure 15:
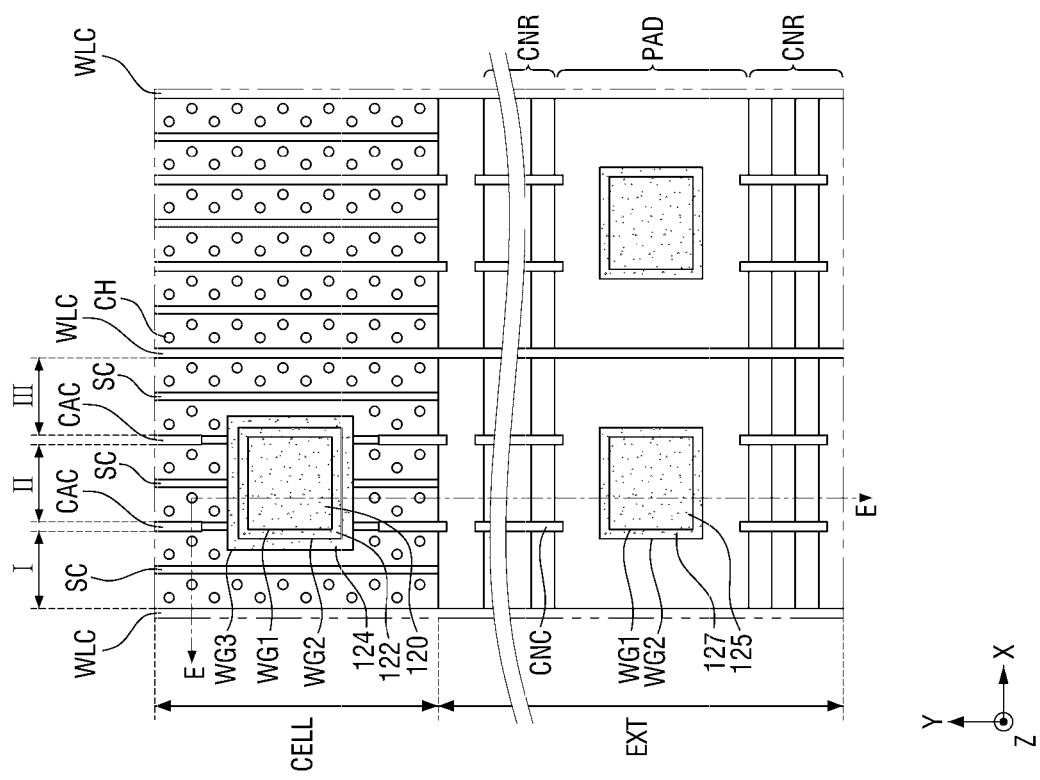
FIG. 15 is a layout diagram illustrating a semiconductor memory device according to some embodiments.
Figure 16:
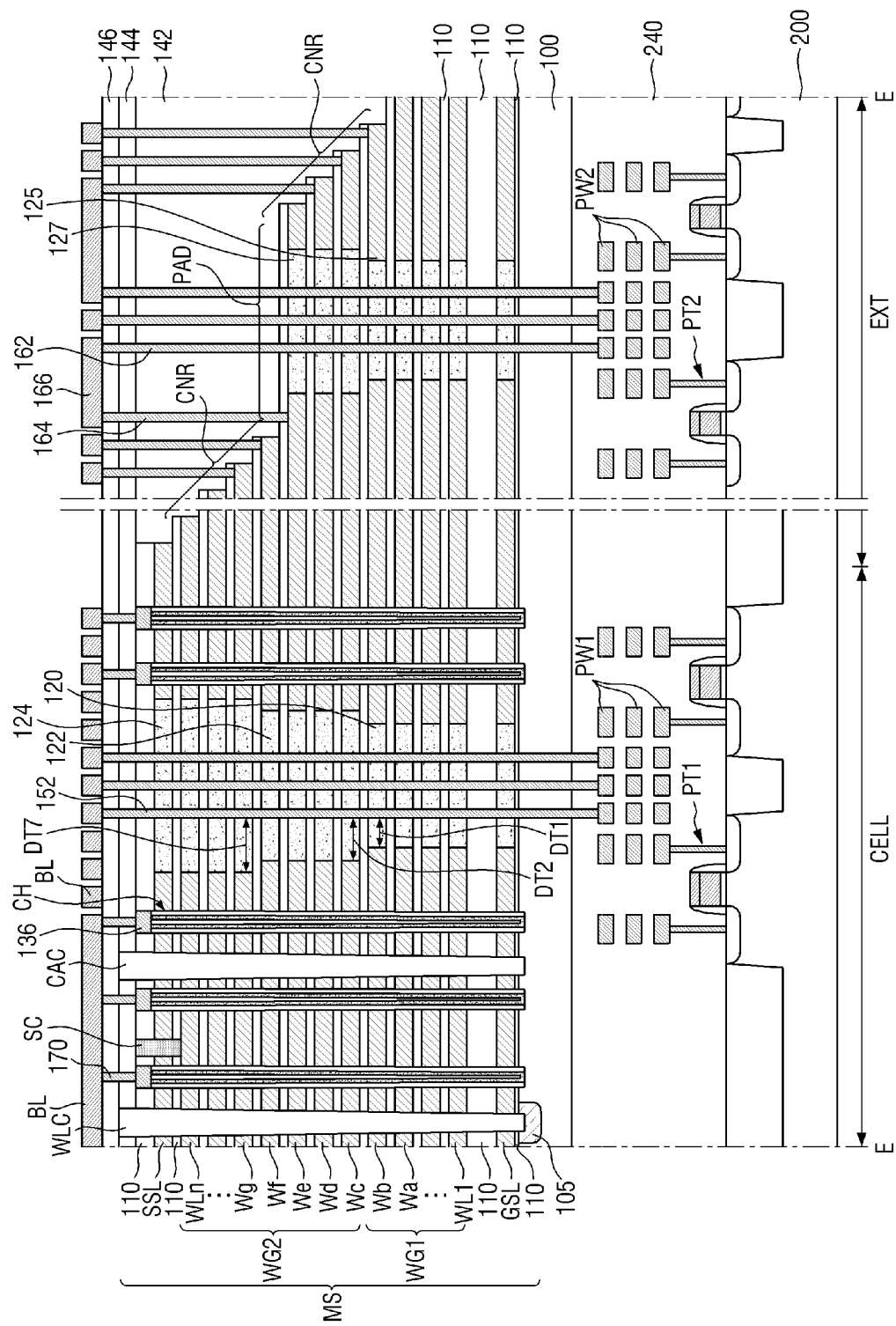
FIG. 16 is a cross-sectional view taken along line E-E of FIG. 15.

FIG. 15 is a layout diagram illustrating a semiconductor memory device according to some embodiments. FIG. 16 is a cross-sectional view taken along line E-E of FIG. 15. For simplicity of description, a description overlapping with the description with reference to FIGS. 1 to 9 may be briefly given or omitted.

Referring to FIGS. 15 and 16, in the semiconductor memory device according to some embodiments, the gate electrodes GSL, WL1 to WLn, and SSL further include a third word line group WG3.

The third word line group WG3 may be stacked on the second word line group WG2. For example, the first word line group WG1 may include some (e.g., WL1 to Wb) of the gate electrodes GSL, WL1 to WLn, and SSL, the second word line group WG2 may include others (e.g., Wc to Wf) of the gate electrodes GSL, WL1 to WLn, and SSL, and the third word line group WG3 may include others (e.g., Wg to WLn) of the gate electrodes GSL, WL1 to WLn, SSL.

In some embodiments, a separation distance of the third word line group WG3 from the first through via 152 may be different from the separation distances of the first word line group WG1 and the second word line group WG2 from the first through via 152. For example, a seventh distance DT7 from the third word line group WG3 to the first through via 152 may be smaller than the first distance DT1 and the second distance DT2.

Further, the first insulating patterns 120 and 122 may include seventh insulating lines 124 that are each formed at the same height as the third word line group WG3. Accordingly, a length (e.g., DT7) of the seventh insulating line 124 interposed between the third word line group WG3 and the first through via 152 may be longer than the first distance DT1 and the second distance DT2.

Figure 17:
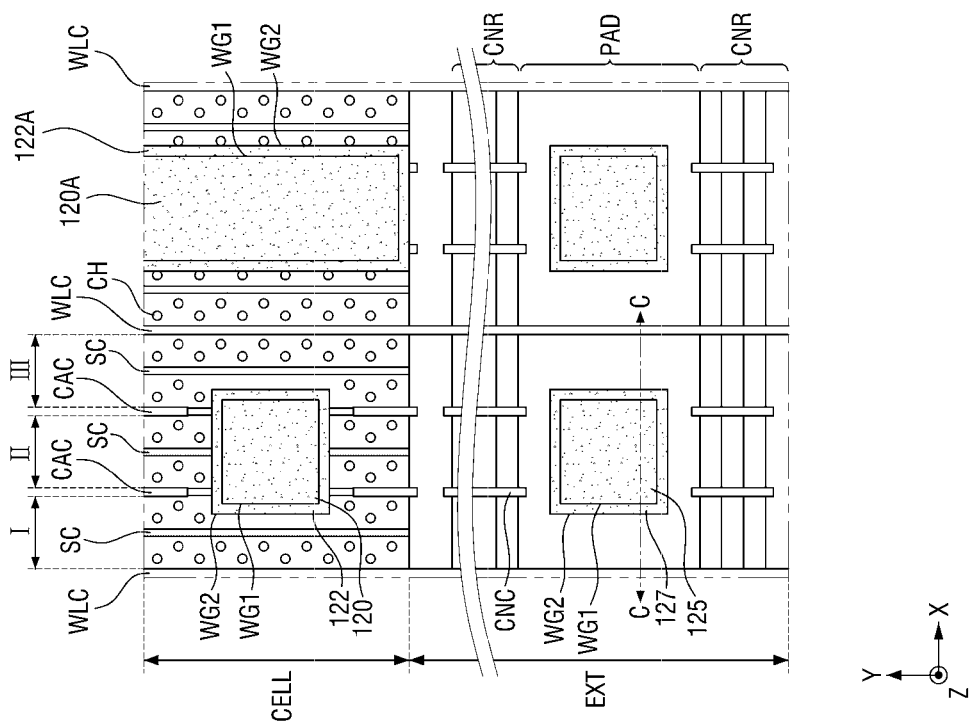
FIG. 17 is a layout diagram illustrating a semiconductor memory device according to some embodiments.

FIG. 17 is a layout diagram illustrating a semiconductor memory device according to some embodiments. For simplicity of description, a description overlapping with the description with reference to FIGS. 1 to 9 may be briefly given or omitted.

Referring to FIG. 17, the semiconductor memory device according to some embodiments further includes third insulating patterns 120A and 122A.

The third insulating patterns 120A and 122A may be formed in the mold structure MS of the cell array region CELL. The third insulating patterns 120A and 122A may be interposed between two adjacent block separation areas WLC. The third insulating patterns 120A and 122A may be spaced apart from the first insulating patterns 120 and 122 in the first direction X and extended in the second direction Y. In some embodiments, the third insulating patterns 120A and 122A may extend in the second direction Y to completely cut the mold structure MS of the cell array region CELL.

The plurality of third insulating patterns 120A and 122A may be formed in the mold structure MS of the cell array region CELL. The plurality of third insulating patterns 120A and 122A may be stacked at the same level as at least some of the plurality of gate electrodes GSL, WL1 to WLn, and SSL.

For example, the third insulating patterns 120A and 122A may include a plurality of eighth insulating lines 120A that are each formed at the same height as the first word line group WG1. Further, the third insulating patterns 120A and 122A may include ninth insulating lines 122A that are each formed at the same height as the second word line group WG2. The cross sections of the eighth insulating lines 120A and the ninth insulating lines 122A may be similar to the cross sections of the first insulating lines 120 and the second insulating lines 122, and detailed descriptions thereof may be omitted below.

In some embodiments, the first through via (e.g., 152 in FIG. 4) may also be formed in the third insulating patterns 120A and 122A in a plan view.

Hereinafter, a method for fabricating a semiconductor memory device according to some embodiments will be described with reference to FIGS. 1 to 26.

FIGS. 18 to 26 are diagrams illustrating the intermediate steps of a method for fabricating a semiconductor memory device according to some embodiments. For simplicity of description, a description overlapping with the description with reference to FIGS. 1 to 16 may be briefly given or omitted.

Figure 18:
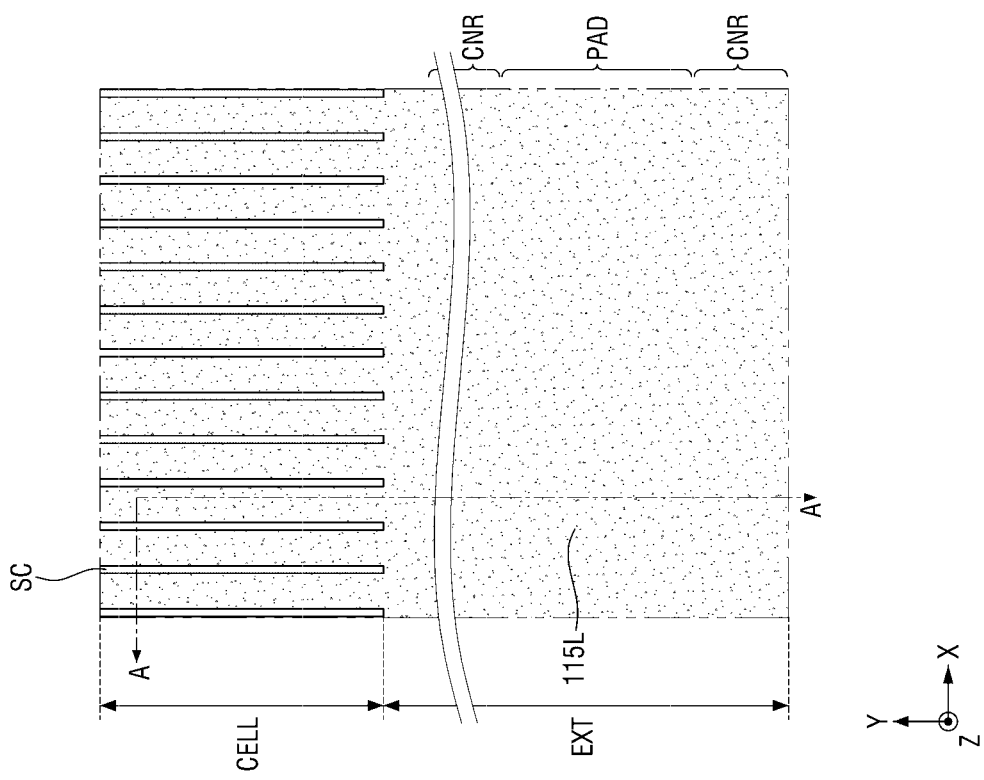
FIGS. 18 to 26 are diagrams illustrating the intermediate steps of a method for fabricating a semiconductor memory device according to some embodiments.
Figure 19:
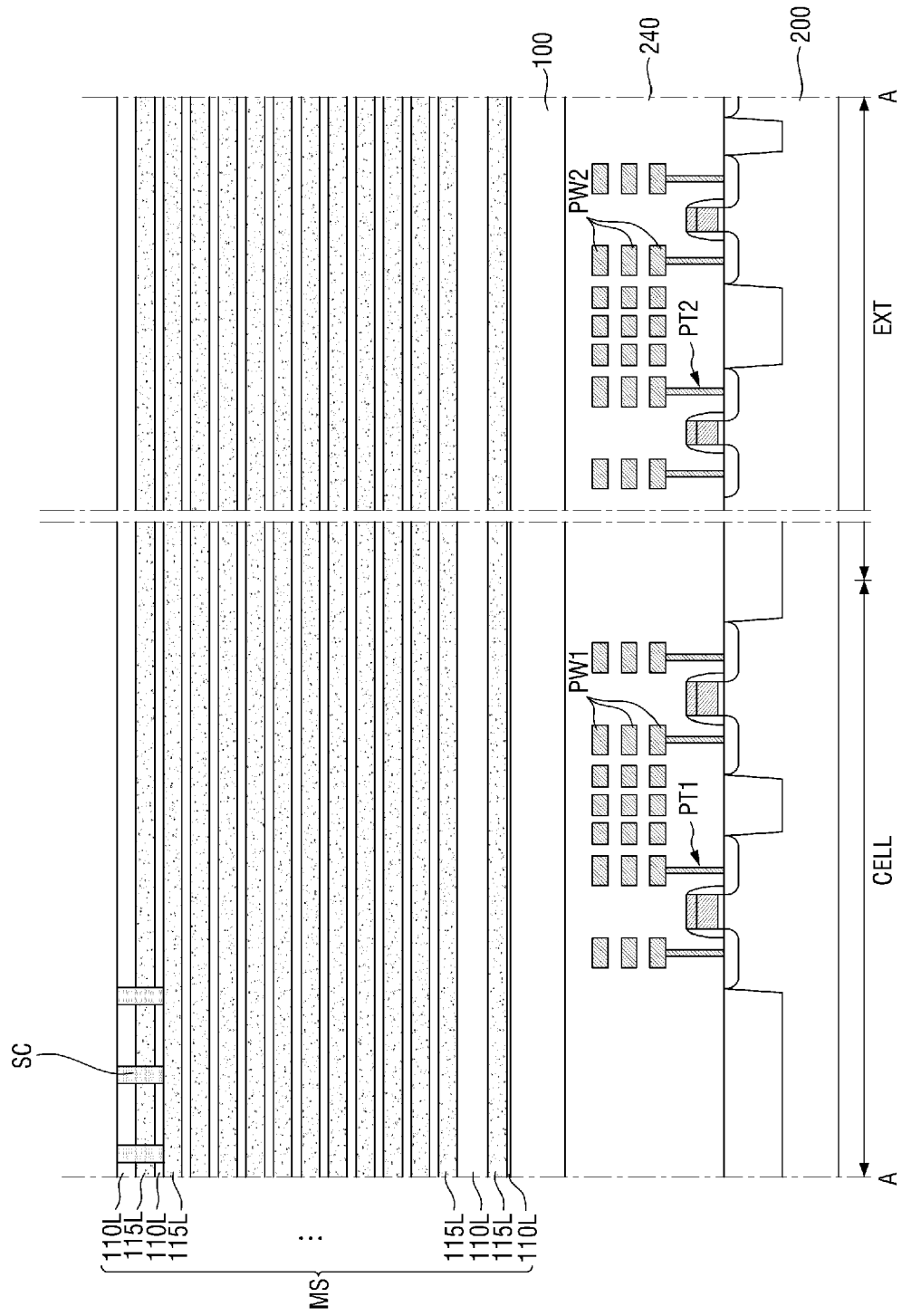

Referring to FIGS. 18 and 19, the mold structure MS is formed on the first substrate 100. For reference, FIG. 19 is a cross-sectional view taken along line A-A of FIG. 18.

The mold structure MS may be formed on the first substrate 100. The mold structure MS may include first preliminary insulating films 110L and second preliminary insulating films 115L which are alternately stacked on the first substrate 100.

In some embodiments, a cutting structure SC may be formed in the mold structure MS of the cell array region CELL. For example, a plurality of cutting structures SC may be arranged in the cell array region CELL along the first direction X. Each of the cutting structures SC may extend in the second direction Y to cut an uppermost insulating film of the second preliminary insulating films 115L.

Figure 20:
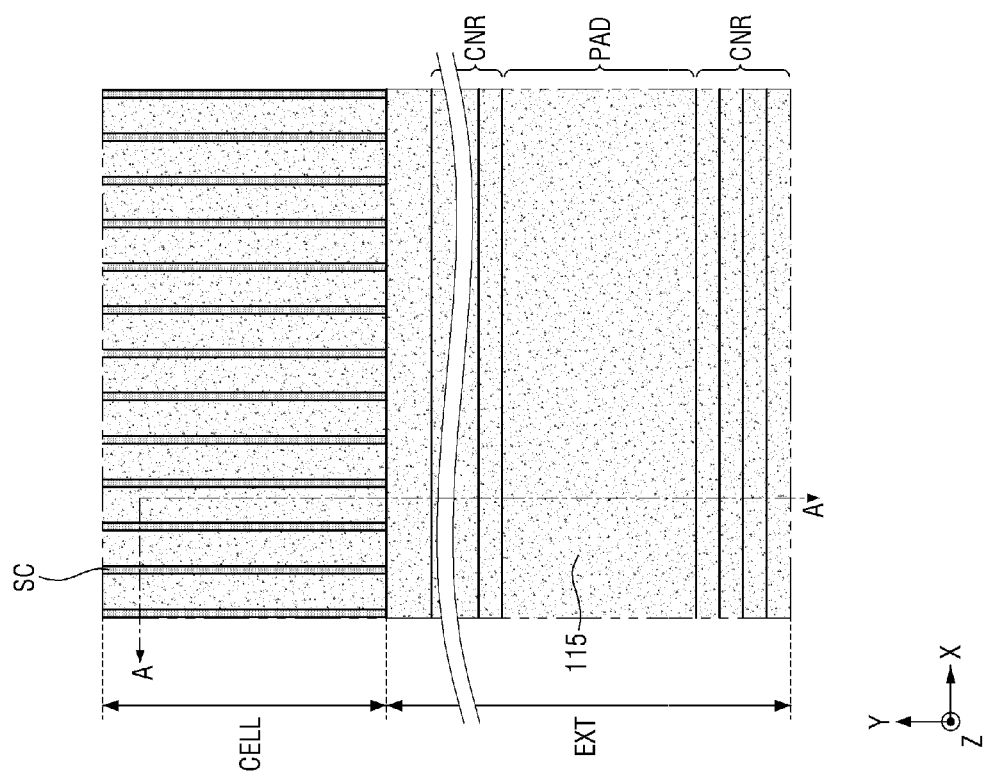
Figure 21:
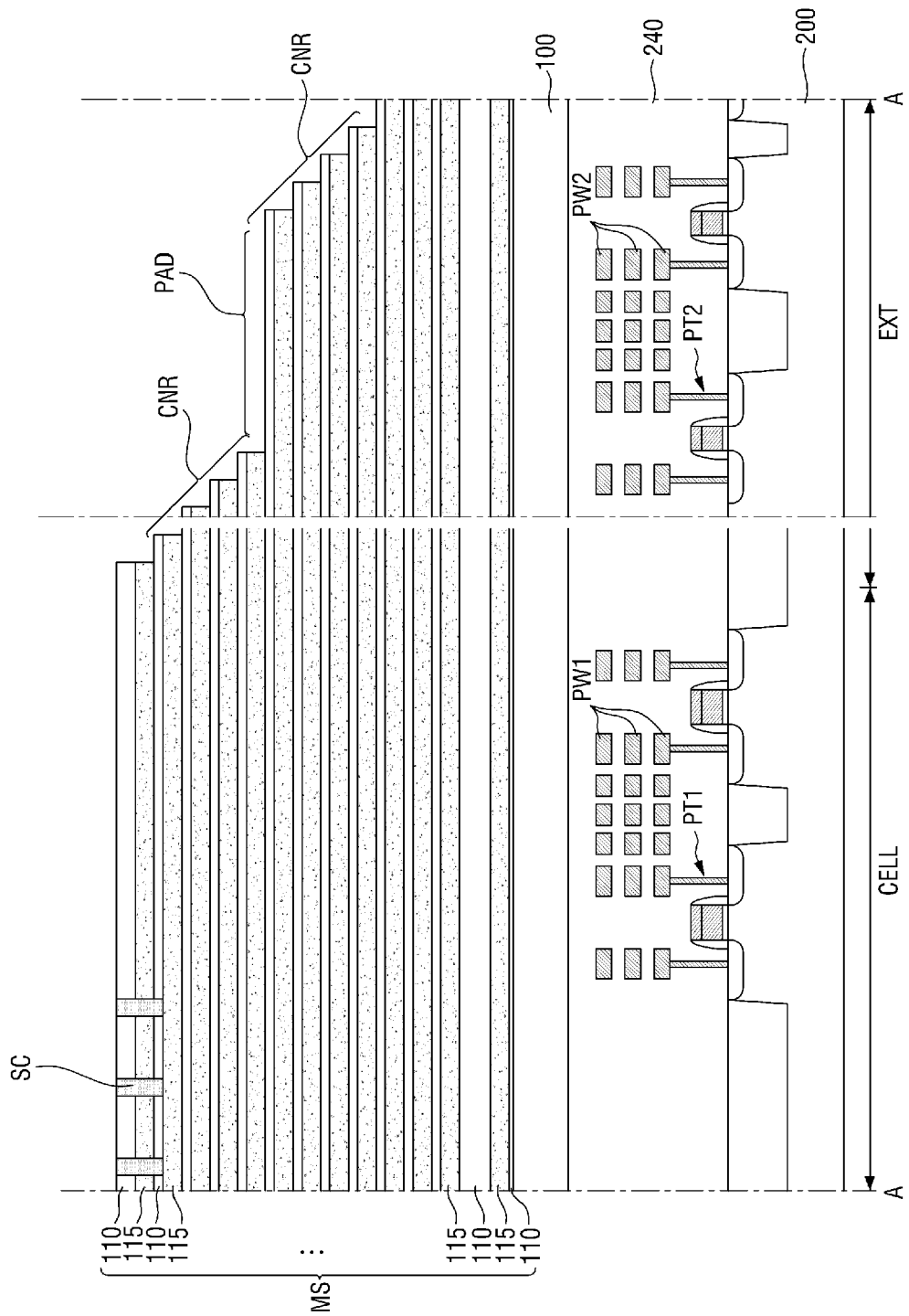

Referring to FIGS. 20 and 21, a portion of the mold structure MS that is in the extension region EXT is patterned in a stepped shape. For reference, FIG. 21 is a cross-sectional view taken along line A-A of FIG. 20.

The first preliminary insulating films 110L may be patterned to form the mold insulating films 110 in a stepped shape along the second direction Y in the extension region EXT. Further, the second preliminary insulating films 115L may be patterned to form preliminary insulating patterns 115 in a stepped shape along the second direction Y in the extension region EXT.

The extension region EXT may include the contact area CNR and the pad area PAD. The contact area CNR and the pad area PAD may be alternately arranged along the second direction Y. In some embodiments, protruding lengths of the preliminary insulating patterns 115 in the pad area PAD may be longer than protruding lengths of the preliminary insulating patterns 115 in the contact area CNR.

Figure 22:
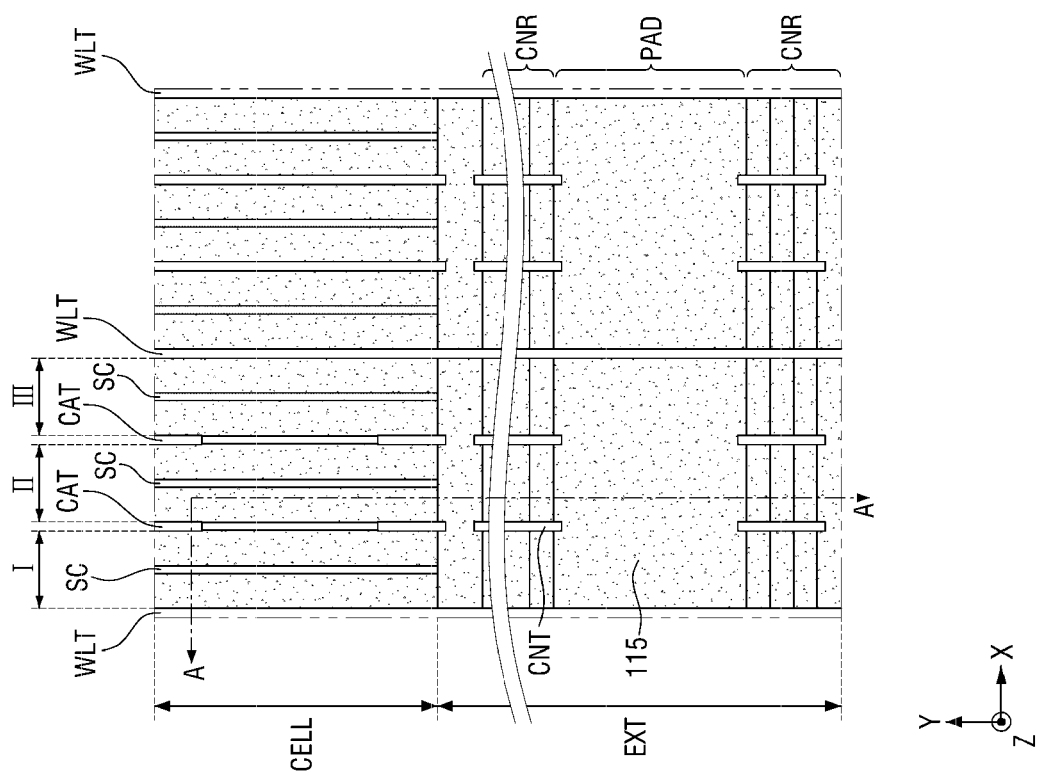
Figure 23:
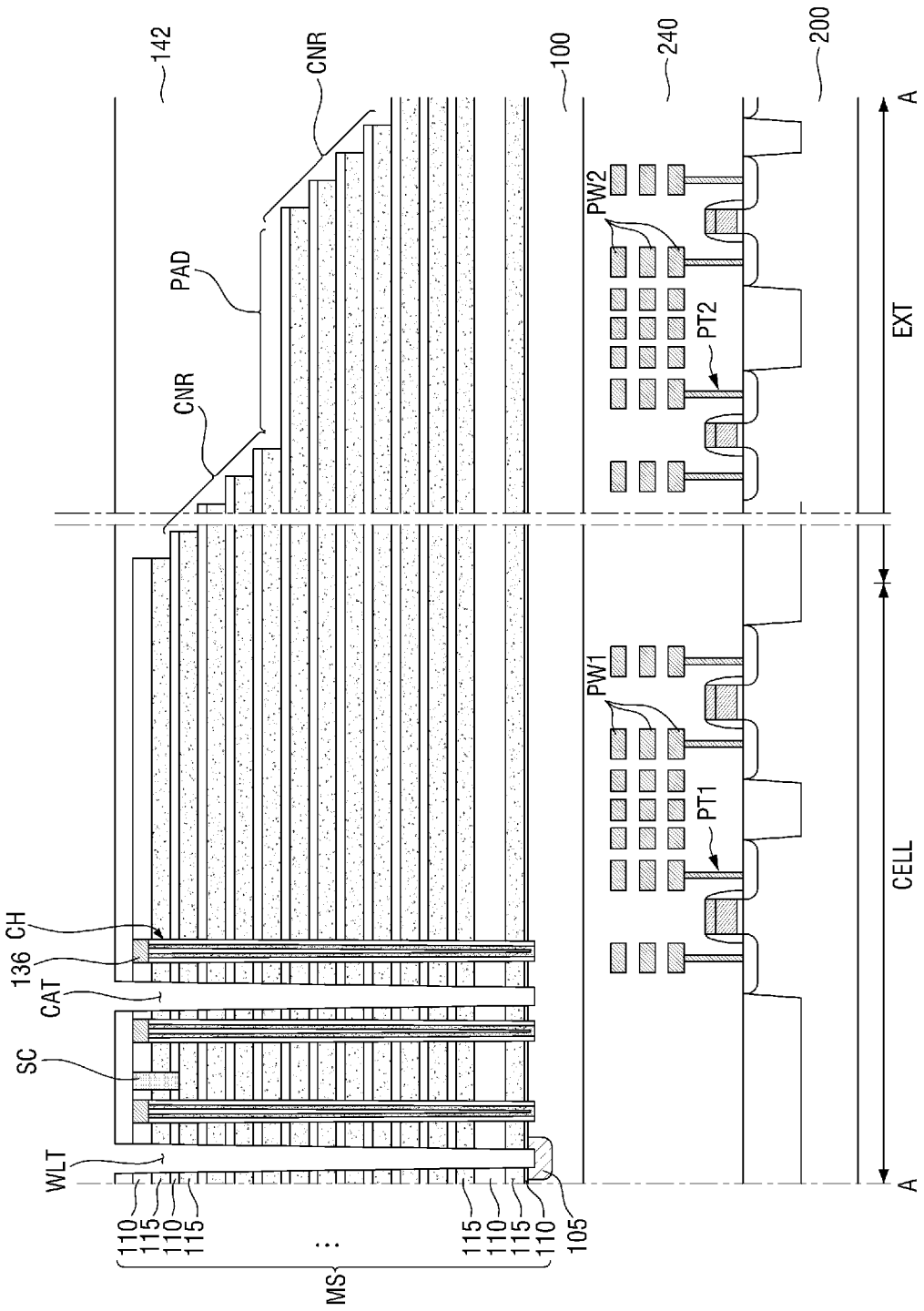

Referring to FIGS. 22 and 23, a channel structure CH, a block separation trench WLT, a cell gate cutting trench CAT and an extension gate cutting trench CNT are formed in the mold structure MS. For reference, FIG. 23 is a cross-sectional view taken along line A-A of FIG. 22.

The channel structure CH may penetrate the mold structure MS. The channel structure CH may extend in a direction crossing the first preliminary insulating films 110L and the second preliminary insulating films 115L. For example, the channel structure CH may have a pillar shape (e.g., a cylindrical shape) extending in the third direction Z.

The block separation trench WLT may be formed in the cell array region CELL and the extension region EXT to cut the plurality of gate electrodes GSL, WL1 to WLn, and SSL. The cell gate cutting trench CAT may be formed in the cell array region CELL to cut the plurality of gate electrodes GSL, WL1 to WLn, and SSL. The extension gate cutting trench CNT may be formed in the extension region EXT to cut the plurality of gate electrodes GSL, WL1 to WLn, and SSL.

Figure 24:
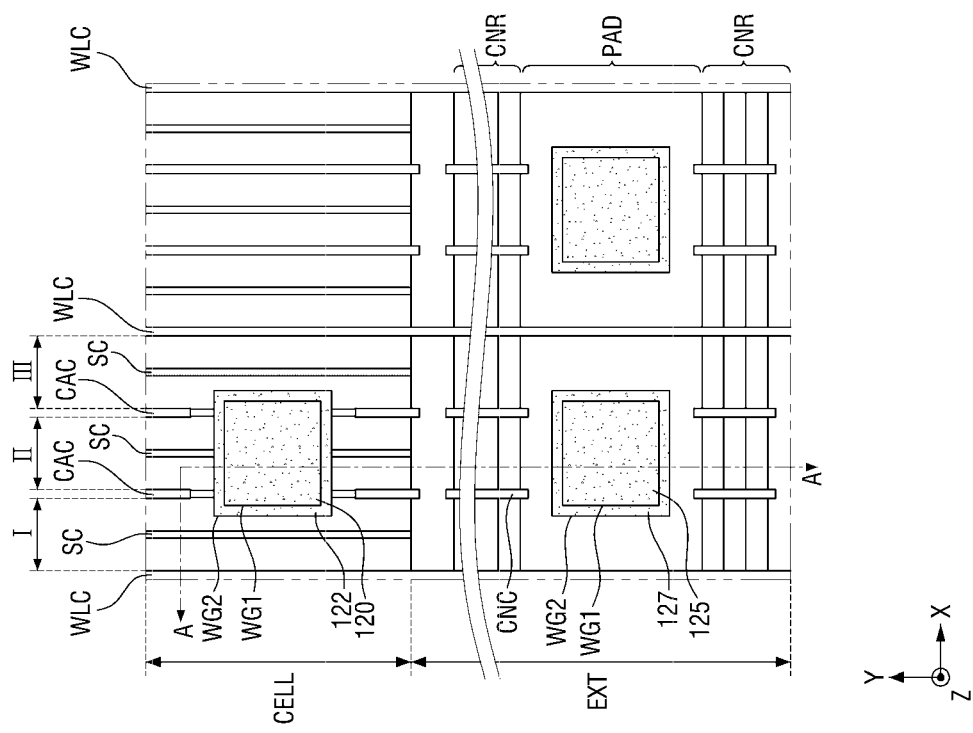
Figure 25:
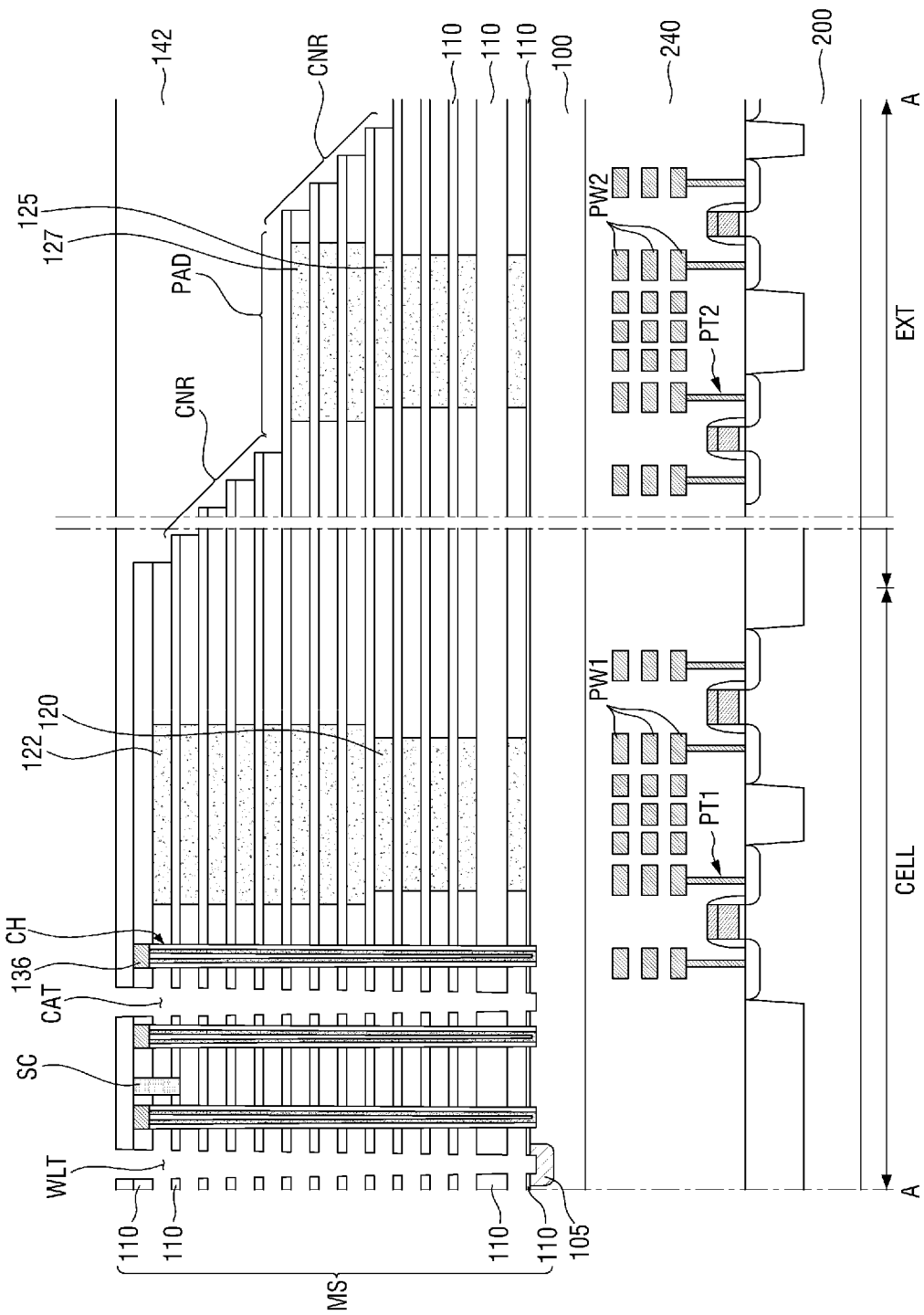

Referring to FIGS. 24 and 25, at least a portion of each preliminary insulating pattern 115 is removed by using (e.g., removed through) the block separation trench WLT, the cell gate cutting trench CAT, and the extension gate cutting trench CNT. For reference, FIG. 25 is a cross-sectional view taken along line A-A of FIG. 24.

For example, a pull-back process that removes at least a portion of each preliminary insulating pattern 115 using (e.g., removed through) the block separation trench WLT, the cell gate cutting trench CAT, and the extension gate cutting trench CNT may be performed. Accordingly, a part of the preliminary insulating patterns 115 may remain to form the first insulating patterns 120 and 122 and the second insulating patterns 125 and 127.

The first insulating patterns 120 and 122 may include a first insulating line 120 and a second insulating line 122 having different widths from each other. For example, a width of the first insulating line 120 may be smaller than a width of the second insulating line 122. Further, the second insulating patterns 125 and 127 may include a third insulating line 125 and a fourth insulating line 127 having different widths from each other. For example, a width of the third insulating line 125 may be smaller than a width of the fourth insulating line 127.

In some embodiments, insulating materials constituting the first insulating line 120 and the third insulating line 125 may have etching selectivity different from insulating materials constituting the second insulating line 122 and the fourth insulating line 127. For example, when the preliminary insulating pattern 115 includes nitride (e.g., silicon nitride), the first insulating line 120 and the third insulating line 125 may have nitrogen ratios different from the second insulating line 122 and the fourth insulating line 127.

Accordingly, the first insulating line 120 and the second insulating line 122 may have different widths by the same pull-back process, and the third insulating line 125 and the fourth insulating line 127 may have different widths by the same pull-back process.

Figure 26:
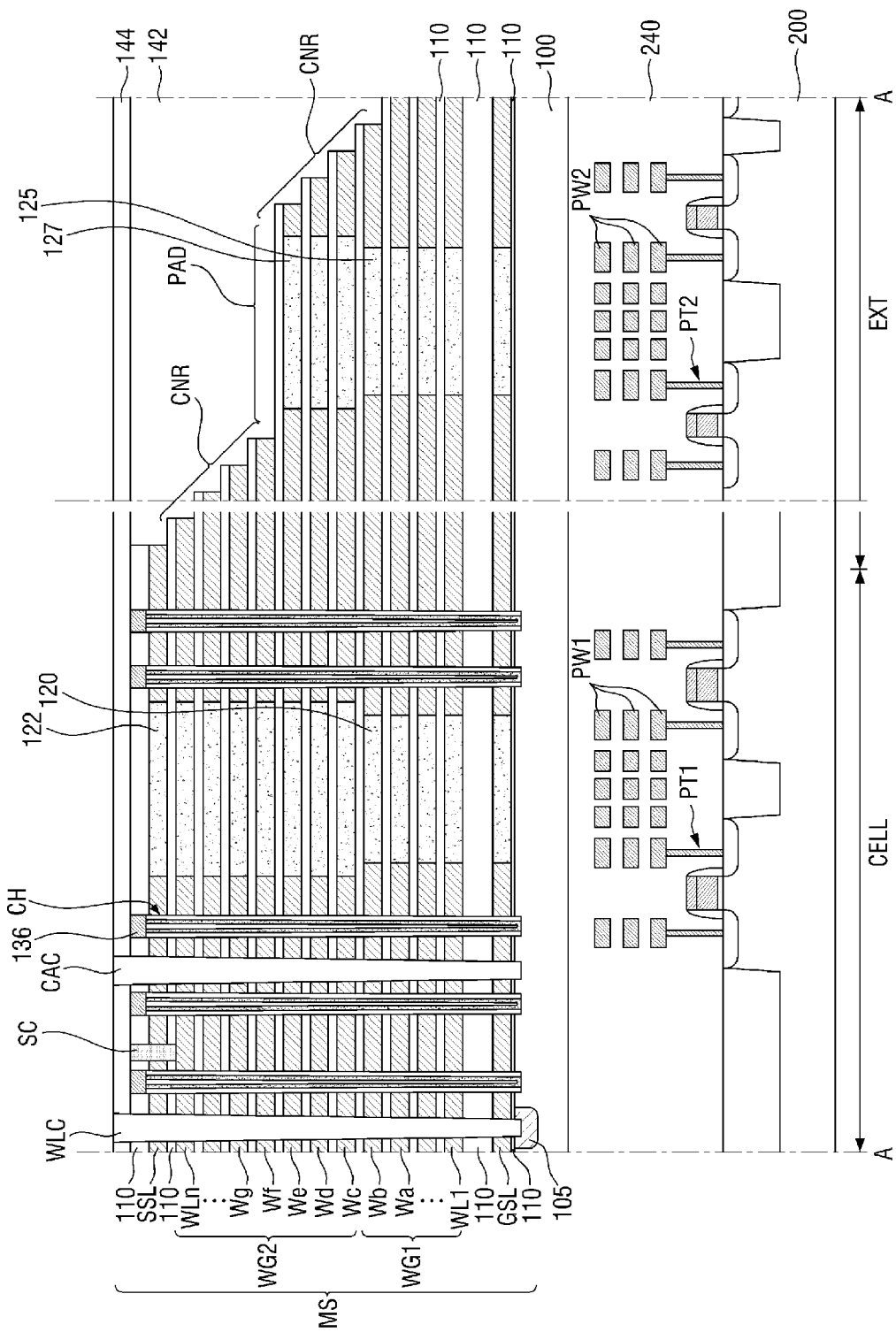

Referring to FIG. 26, the plurality of gate electrodes GSL, WL1 to WLn, and SSL that are alternately stacked with the mold insulating films 110 are formed.

For example, the plurality of gate electrodes GSL, WL1 to WLn, and SSL may be formed in a region where at least a portion of the preliminary insulating patterns 115 is removed. That is, the region where at least a portion of the preliminary insulating patterns 115 is removed may be replaced with the plurality of gate electrodes GSL, WL1 to WLn, and SSL. Accordingly, the first word line group WG1 adjacent to the first insulating lines 120 and the third insulating lines 125 may be formed, and the second word line group WG2 adjacent to the second insulating lines 122 and the fourth insulating lines 127 may be formed.

Subsequently, the block separation area WLC, the cell gate cutting area CAC, and the extension gate cutting area CNC may be formed to fill the block separation trench WLT, the cell gate cutting trench CAT, and the extension gate cutting trench CNT, respectively.

Thereafter, referring to FIGS. 3 and 4, the above-described first through via 152, second through via 162, gate contact 164, bit line BL, and connection wiring 166 may be formed. Accordingly, it may be possible to provide a method for fabricating a semiconductor memory device having improved product reliability.

While the present inventive concept has been particularly shown and described with reference to example embodiments thereof, it will be understood by those of ordinary skill in the art that various changes in form and details may be made therein without departing from the scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor memory device comprising:
a mold structure including a first region and a second region on a first substrate, the first region including gate electrodes and mold insulating films that are alternately stacked on the first substrate, the second region including the mold insulating films and first insulating patterns that are alternately stacked on the first substrate, and the gate electrodes being at the same level as the first insulating patterns;
a channel structure penetrating the mold structure and crossing a respective level of each of the gate electrodes; and a first through via in the second region, the first through via penetrating the first substrate and the mold structure, wherein the first insulating patterns include a material different from that of the mold insulating films, wherein the mold structure includes a cell array region and an extension region that are adjacent each other in a first direction, wherein in the extension region, the gate electrodes collectively have a stepped shape along the first direction, wherein the second region of the mold structure is in the extension region, wherein the gate electrodes include a first word line and a second word line on the first word line, and wherein a first distance from a first boundary surface between the first word line and a first one of the first insulating patterns to the first through via is different from a second distance from a second boundary surface between the second word line and a second one of the first insulating patterns to the first through via.

2. The semiconductor memory device of claim 1, wherein the first distance is smaller than the second distance.

3. The semiconductor memory device of claim 1, further comprising:
a bit line extending in a second direction crossing the first direction and electrically connected to the channel structure; and
a block separation area extending in the first direction to cut the mold structure.

4. The semiconductor memory device of claim 3,
wherein the mold structure further includes a third region,
wherein the third region includes the mold insulating films and second insulating patterns that are alternately stacked on the first substrate,
wherein the second insulating patterns include a material different from that of the mold insulating films,
wherein the gate electrodes are at the same level as the second insulating patterns,
wherein the semiconductor memory device further comprises a second through via in the third region, the second through via penetrating the first substrate and the mold structure, and
wherein the second insulating patterns and the second through via are in the cell array region.

5. The semiconductor memory device of claim 4,
wherein the second through via is electrically connected to the bit line, and
wherein the first through via is electrically connected to each of the gate electrodes.

6. The semiconductor memory device of claim 4, wherein the first insulating patterns and the second insulating patterns include the same material.

7. The semiconductor memory device of claim 1, further comprising:
a through insulator penetrating the mold insulating films in the second region,
wherein the first through via penetrates the through insulator.

8. The semiconductor memory device of claim 1, further comprising:
a second substrate;
a peripheral circuit element on the second substrate; and
an interlayer insulating film on the peripheral circuit element,
wherein the mold structure is on the interlayer insulating film, and
wherein the first through via penetrates the interlayer insulating film and is electrically connected to the peripheral circuit element.

9. The semiconductor memory device of claim 1, wherein the gate electrodes further include a third word line on the second word line, and
wherein a third distance from a third boundary surface between the third word line and a third one of the first insulating patterns to the first through via is different from the first distance and the second distance.

10. The semiconductor memory device of claim 9,
wherein the first distance is smaller than the second distance, and
wherein the second distance is greater than the third distance.

11. A semiconductor memory device comprising:
a mold structure including a plurality of gate electrodes that are spaced apart from each other and stacked on a substrate;
a channel structure penetrating the mold structure and crossing a respective level of each of the gate electrodes;
a plurality of insulating patterns spaced apart from each other and stacked in the mold structure; and
a through via in the insulating patterns, the through via penetrating the substrate and the mold structure,
wherein the gate electrodes include a first word line and a second word line on the first word line,
wherein the insulating patterns include a first insulating line stacked at the same level as the first word line, and a second insulating line stacked at the same level as the second word line, and
wherein a first distance from a first boundary surface between the first word line and the first insulating line to the through via is different from a second distance from a second boundary surface between the second word line and the second insulating line to the through via.

12. The semiconductor memory device of claim 11, wherein a thickness of the first word line is the same as a thickness of the first insulating line, and
wherein a thickness of the second word line is the same as a thickness of the second insulating line.

13. The semiconductor memory device of claim 11,
wherein the first boundary surface is convex toward the first insulating line, and
wherein the second boundary surface is convex toward the second insulating line.

14. The semiconductor memory device of claim 11,
wherein the mold structure includes an extension region where the gate electrodes collectively have a stepped shape,
wherein the insulating patterns are in the extension region and further include a third insulating line at a top level of the insulating patterns,
wherein the gate electrodes further include a third word line stacked at the same level as the third insulating line, and
wherein a third distance from a third boundary surface between the third word line and the third insulating line to the through via is smaller than the first distance and the second distance.

15. The semiconductor memory device of claim 14,
wherein the gate electrodes further include a fourth word line on a first portion of the third word line, and
wherein a thickness of a second portion of the third word line that does not have the fourth word line thereon is greater than a thickness of the first word line and a thickness of the second word line.

16. The semiconductor memory device of claim 11, wherein the first distance is smaller than the second distance, and
wherein a thickness of the first insulating line is greater than a thickness of the second insulating line.

17. A semiconductor memory device comprising:
a plurality of mold insulating films spaced apart from each other and stacked on a substrate;
a first word line group alternately stacked with some of the mold insulating films;
a second word line group on the first word line group, the second word line group being alternately stacked with others of the mold insulating films;
a channel structure crossing levels of each of the mold insulating films, the first word line group, and the second word line group;
a plurality of first insulating lines spaced from each other and alternately stacked with the some of the mold insulating films;
a plurality of second insulating lines on the first insulating lines, the second insulating lines being spaced from each other and alternately stacked with the others of the mold insulating films; and
a first through via crossing the levels of each of the mold insulating films, levels of each of the first insulating lines, and levels of each of the second insulating lines,
wherein the first insulating lines and the second insulating lines comprise a material that is different from that of the mold insulating films, and the first insulating lines comprise a different composition ratio of the material than the second insulating lines,
wherein the first insulating lines are at the same level as the first word line group, and
wherein the second insulating lines are at the same level as the second word line group.

18. The semiconductor memory device of claim 17, wherein the mold insulating films include oxide,
wherein the first insulating lines and the second insulating lines include nitride, and
wherein a nitrogen ratio of each of the first insulating lines is different from a nitrogen ratio of each of the second insulating lines.

19. The semiconductor memory device of claim 17, further comprising:
a bit line extending in a first direction and electrically connected to the channel structure; and
a block separation area extending in a second direction crossing the first direction,
wherein the block separation area cuts the first word line group and the second word line group,
wherein a cell array region of the semiconductor memory device and an extension region of the semiconductor memory device are adjacent each other in the second direction, and
wherein in the extension region, the first word line group and the second word line group each have a stepped shape along the second direction.

20. The semiconductor memory device of claim 19, wherein the first insulating lines and the second insulating lines are in the extension region.

* * * * *